(12) United States Patent
Shinohara

(10) Patent No.: US 8,237,267 B2
(45) Date of Patent: *Aug. 7, 2012

(54) SEMICONDUCTOR DEVICE HAVING A MICROCOMPUTER CHIP MOUNTED OVER A MEMORY CHIP

(75) Inventor: Minoru Shinohara, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/023,132

(22) Filed: Feb. 8, 2011

(65) Prior Publication Data

US 2011/0140285 A1 Jun. 16, 2011

Related U.S. Application Data

(63) Continuation of application No. 12/331,291, filed on Dec. 9, 2008, now Pat. No. 7,888,796.

(30) Foreign Application Priority Data

Dec. 14, 2007 (JP) .................................. 2007-323293

(51) Int. Cl.
H01L 23/34 (2006.01)

(52) U.S. Cl. .... 257/724; 257/777; 257/786; 257/E23.01

(58) Field of Classification Search .................. None
See application file for complete search history.

(56) References Cited

U.S. PATENT DOCUMENTS

| | | | |
|---|---|---|---|
| 6,376,904 B1 | 4/2002 | Haba et al. | |
| 7,355,272 B2 | 4/2008 | Kuroda et al. | |
| 7,375,419 B2 * | 5/2008 | Mess et al. | 257/686 |
| 7,576,431 B2 * | 8/2009 | Takahashi | 257/777 |
| 7,741,723 B2 | 6/2010 | Uchida | |
| 7,768,117 B2 | 8/2010 | Haba et al. | |
| 7,786,595 B2 | 8/2010 | Shen et al. | |
| 7,888,796 B2 * | 2/2011 | Shinohara | 257/724 |
| 2001/0031513 A1 | 10/2001 | Masuda et al. | |
| 2005/0139985 A1 | 6/2005 | Takahashi | |
| 2006/0087013 A1 * | 4/2006 | Hsieh | 257/678 |
| 2006/0097285 A1 * | 5/2006 | Nishizawa | 257/203 |
| 2007/0278697 A1 * | 12/2007 | Kuroda | 257/777 |
| 2008/0254571 A1 * | 10/2008 | Corisis et al. | 438/109 |
| 2009/0057902 A1 * | 3/2009 | Chen et al. | 257/741 |

FOREIGN PATENT DOCUMENTS

| | | |
|---|---|---|
| JP | 2001-298150 A | 10/2001 |
| JP | 2005-191213 A | 7/2005 |
| JP | 2005-286126 A | 10/2005 |

\* cited by examiner

*Primary Examiner* — Alonzo Chambliss

(74) *Attorney, Agent, or Firm* — Miles & Stockbridge P.C.

(57) ABSTRACT

A semiconductor device with semiconductor chips stacked thereon is provided. The semiconductor device is reduced in size and thickness. In a first memory chip and a second memory chip, first pads of the first memory chip located at a lower stage and hidden by the second memory chip located at an upper stage are drawn out by re-wiring lines, whereby the first pads projected and exposed from the overlying second memory chip and second pads of the second memory chip can be coupled together through wires. Further, a microcomputer chip and third pads formed on re-wiring lines are coupled together through wires over the second memory chip, whereby wire coupling of the stacked memory chips can be done without intervention of a spacer.

4 Claims, 33 Drawing Sheets

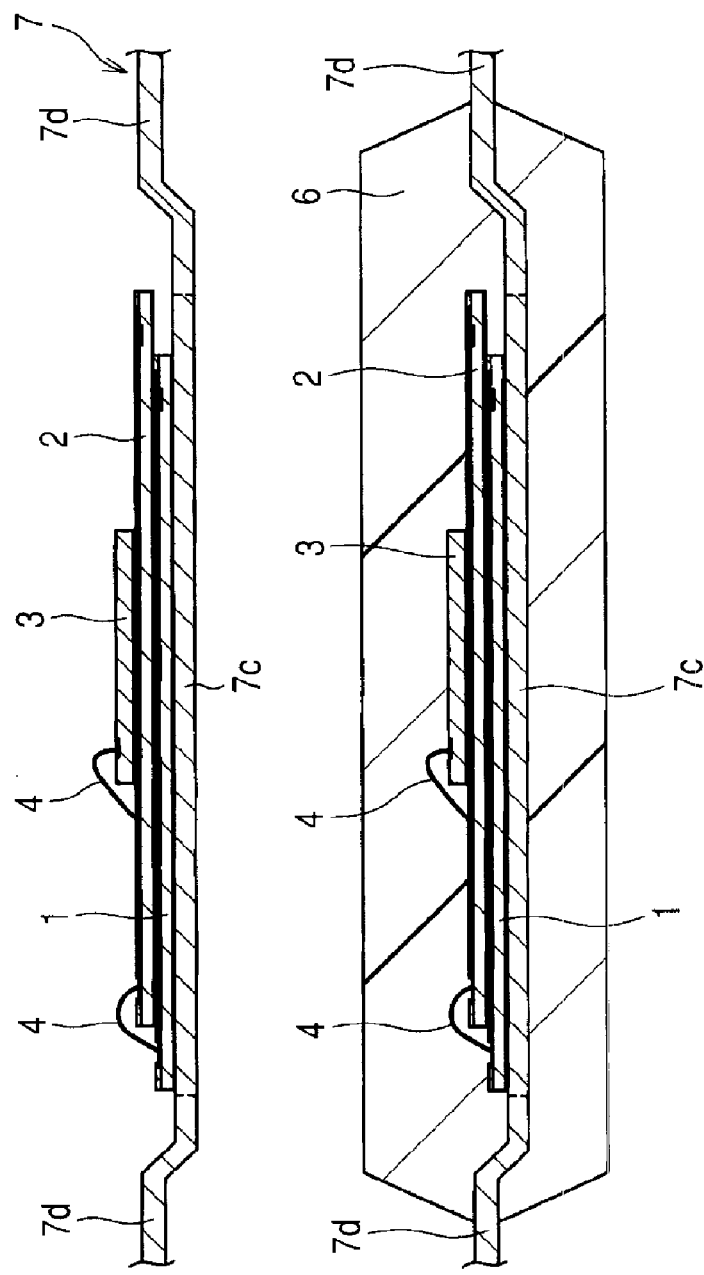
FIG. 23
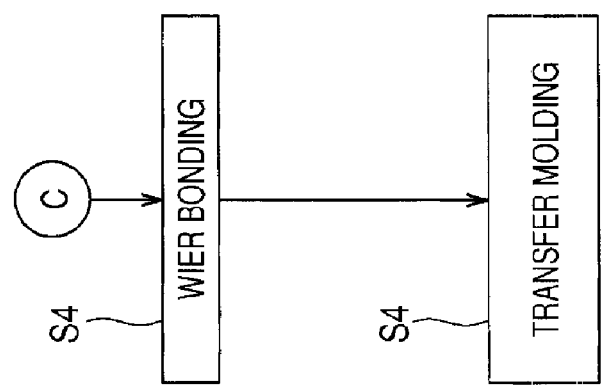

ized along plural sides (e.g., two sides confronting each other). In comparison with the microcomputer chip, the memory chip is smaller in the number of pins, but the latter configuration, i.e., the configuration with pads arranged along plural sides, is more effective when the distribution of wiring is taken into account which wiring is distributed from the pads on the memory chip up to external terminals (solder bumps) formed correspondingly to the chip pads on a back surface of a wiring substrate with the memory chip mounted thereon.

SEMICONDUCTOR DEVICE HAVING A MICROCOMPUTER CHIP MOUNTED OVER A MEMORY CHIP

CROSS-REFERENCE TO RELATED APPLICATIONS

This application is a continuation of U.S. Application Ser. No. 12/331,291 filed Dec. 9, 2008 now U.S. Pat. No. 7,888,796. Also, the disclosure of Japanese Patent Application No. 2007-323293 filed on Dec. 14, 2007 including the specification, drawings and abstract is incorporated herein by references in its entirety.

BACKGROUND OF THE INVENTION

The present invention relates to a semiconductor device and more particularly to a semiconductor device with a microcomputer chip and plural memory chips mounted thereon.

According to a known technique (see, for example, Patent Literature 1), plural memory chips each having pads arranged on plural sides are stacked and further a microcomputer chip is stacked on those memory chips to configure a system.

According to another known technique (see, for example, Patent Literature 2), first electrode pads formed on a main surface of a semiconductor chip, as well as first bonding pads and first central bonding pads formed in an upper region with respect to the main surface of the semiconductor chip, are coupled together in one-to-one correspondence by a first re-wiring layer, and second electrode pads formed on the main surface of the semiconductor chip, as well as second bonding pads and second central bonding pads formed in an upper region with respect to the main surface of the semiconductor chip are coupled together in one-to-one correspondence by a second re-wiring layer.

[Patent Literature 1]
Japanese Patent Laid-Open Publication No. 2005-286126
[Patent Literature 2]
Japanese Patent Laid-Open Publication No. 2005-191213

SUMMARY OF THE INVENTION

Recently, for building a system by one semiconductor device, there has been proposed an SIP (System In Package) configuration wherein a microcomputer chip and a memory chip are together mounted on a single semiconductor device, as shown in Patent Literature 1. The microcomputer chip, also called a controller chip, is a semiconductor chip having an arithmetic processing function (internal interface) of controlling the memory chip provided in the interior of the system and an arithmetic processing function (external interface) of processing input and output of data for an external LSI provided in the exterior of the system.

As configurations of the memory chip mounted on such an SIP there are a configuration wherein pads are arranged along one side and a configuration wherein pads are arranged along plural sides (e.g., two sides confronting each other). In comparison with the microcomputer chip, the memory chip is smaller in the number of pins, but the latter configuration, i.e., the configuration with pads arranged along plural sides, is more effective when the distribution of wiring is taken into account which wiring is distributed from the pads on the memory chip up to external terminals (solder bumps) formed correspondingly to the chip pads on a back surface of a wiring substrate with the memory chip mounted thereon.

Further, as the capacity of the semiconductor device becomes larger, there is a tendency that plural memory chips are mounted on the semiconductor device. In case of mounting one microcomputer chip and plural memory chips on one semiconductor device, it is first considered to adopt such a configuration as shown in a comparative example of FIGS. 30 and 31 wherein chips (two memory chips 22 and one microcomputer chip 23) are placed flatways on a wiring substrate 21. However, such a flatways mounting gives rise to the problem that the area in the planar direction of the semiconductor device becomes large and it is impossible attain the reduction in size of the semiconductor device.

To avoid such a problem it has been proposed to adopt a stacking structure wherein all the semiconductor chips are stacked.

However, if semiconductor chips are simply stacked, then in the case of a memory chip having pads arranged along plural sides, the pads on a lower-stage semiconductor chip are covered with a semiconductor chip stacked as an upper-stage chip on the lower-stage chip, so that it becomes difficult to make coupling with wires.

It is also considered to adopt such a configuration as shown in a comparative example of FIGS. 32 and 33 wherein a spacer 24 is interposed between chips (memory chips 22) to ensure a space permitting wire bonding on the underlying chip and in this state there is performed wire coupling. In this case, the intervention of the spacer 24 gives rise to the problem that the height of the semiconductor device becomes larger and it is impossible to attain the reduction in thickness (reduction in size) of the semiconductor device.

As a measure for solving this problem it is considered to adopt such a configuration as shown in Patent Literature 1 wherein the upper memory chip is mounted on the lower memory chip at an angle of 90° relative to the lower memory chip (so as to cross each other).

However, in the case where two memory chips are stacked so as to cross each other, it is necessary that the area of the wiring substrate for mounting those semiconductor chips be made large, thus making it difficult to attain the reduction in size of the semiconductor device. Moreover, when pads are arranged along long sides of memory chips, a portion of the pads on the lower-stage memory chip are covered with the upper-stage memory chip stacked on the lower-stage memory chip and it becomes difficult to couple wires to those pads.

To solve this problem it is considered to adopt such a technique as shown in Patent Literature 2 wherein the pads on the lower-stage semiconductor chip hidden by stacking are drawn out and exposed by re-wiring and in this state there is performed wire coupling. According to this configuration, the semiconductor chips can be stacked in an aligned manner and it is possible to attain the reduction in size of the semiconductor device as compared with the configuration shown in Patent Literature 1.

However, the present inventors are making a study about the configuration wherein a microcomputer chip and memory chips are together mounted on a single semiconductor device in order to build a system by one semiconductor device. Further, we are making a study about a configuration (stacking structure) which, within this system, not only permits electrical coupling between the microcomputer chip and the memory chips but also permits easy coupling between an external device (external LSI) provided in the exterior of the system built with the semiconductor chips and the microcomputer chip.

In Patent Literature 2 there is found no description about mounting a microcomputer chip together with memory chips on a single semiconductor device. In Patent Literatures 1 and 2 there is found no description about a configuration which not only permits electrical coupling between a microcomputer chip and memory chips but also permits easy coupling between a microcomputer chip and the exterior (external LSI) of the system.

It is an object of the present invention to provide a technique which can attain the reduction in size and thickness of a semiconductor device with semiconductor chips stacked thereon.

It is another object of the present invention to provide a technique which permits efficient mounting of a microcomputer chip and plural memory chips on a semiconductor device.

The above and other objects and novel features of the present invention will become apparent from the following description and the accompanying drawings.

Typical modes of the present invention as disclosed herein will be outlined below.

In one aspect of the present invention there is provided a semiconductor device comprising a plurality of stacked memory chips each having a plurality of pads formed along two opposed sides of a main surface thereof, a microcomputer chip mounted over the memory chip located at the top stage out of the plural memory chips, and a plurality of external terminals coupled electrically to the microcomputer chip. Each of the plural memory chips includes first pads formed over the main surface thereof along one of the two opposed sides of the main surface, lead-out wiring lines coupled electrically to the first pads, second pads formed over the main surface of the memory chip along the other of the two opposed sides of the main surface and coupled electrically to the lead-out wiring lines, and third pads coupled electrically to terminals of the microcomputer chip through wires over the lead-out wiring lines. The second pads of the memory chip located at an upper stage and the second pads of the memory chip located at a lower stage and projected and exposed from the upper-stage memory chip, out of the stacked memory chips, are coupled together electrically using wires.

In another aspect of the present invention there is provided a semiconductor device comprising a substrate, the substrate having a chip mounting portion and a plurality of terminals formed around the chip mounting portion, a memory chip mounted over the chip mounting portion of the substrate, the memory chip having a quadrangular plane shape and having a main surface with a plurality of pads formed thereon, and a microcomputer chip mounted over the main surface of the memory chip, the microcomputer chip having a quadrangular plane shape and having a main surface with a plurality electrodes formed thereon. The semiconductor device further comprises a plurality of first wires for coupling the electrodes of the microcomputer chip and the pads of the memory chip electrically with each other and a plurality of second wires for coupling the pads of the memory chip and the terminals of the substrate electrically with each other. The microcomputer chip is mounted over the memory chip in such a manner that one side thereof stands side by side with one side of the memory chip. The pads of the memory chip include a plurality of first pads formed along the one side of the memory chip, a plurality of second pads positioned closer to the microcomputer chip than the first pads, and a plurality of wiring lines for coupling between the first pads and the second pads. The electrodes of the microcomputer chip include a plurality of electrodes for internal interface to perform input and output of data for the interior of a system comprised of the memory chip and the microcomputer chip, and the first wires include a plurality of wires for internal interface to couple the microcomputer chip and the memory chip electrically with each other. Further, the electrodes for internal interface of the microcomputer chip and the second pads are coupled together electrically through the wires for internal interface.

The following is a brief description of effects obtained by the typical modes of the present invention as disclosed herein.

With respect to stacked memory chips, by drawing out pads of the lower memory chip hidden by the upper memory chip through lead-out wiring lines, the pads projected and exposed from the upper memory chip and the pads of the upper memory chip can be coupled together through wires. Moreover, by coupling the electrodes of the microcomputer chip and pads formed on the lead-out wires through wires over the top memory chip, it is possible to effect wire coupling of the stacked memory chips without intervention of a spacer.

As a result, in comparison with the semiconductor device of the structure wherein plural memory chips and a microcomputer chip are placed flatways, it is possible to reduce the area in the planar direction and hence possible to attain the reduction in size of the semiconductor device wherein plural memory chips and a microcomputer chip are stacked.

Moreover, since wire bonding of stacked memory chips can be done without intervention of a spacer, it is possible to attain the reduction in thickness (reduction in size) as compared with the semiconductor device requiring the intervention of a spacer.

Further, a microcomputer chip and plural memory chips can be mounted efficiently on a semiconductor device of SIP structure.

BRIEF DESCRIPTION OF THE DRAWINGS

FIG. 23 is a sectional view in the package longitudinal direction, showing a structural example stepwise from wire bonding step to resin molding step in assembling the semiconductor device of FIG. 1;

DETAILED DESCRIPTION OF A PREFERRED EMBODIMENT

Figure 1:
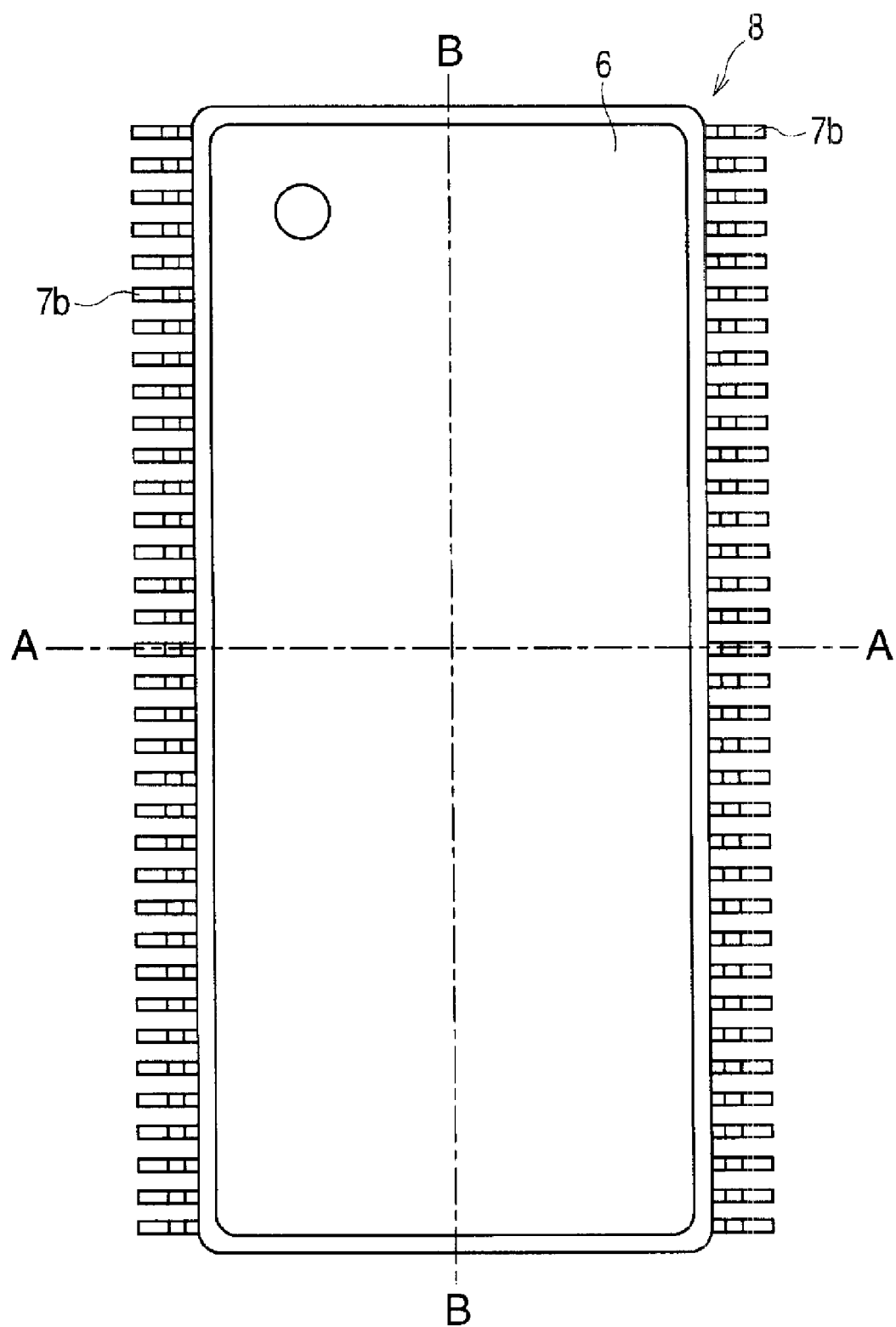
FIG. 1 is a plan view showing a structural example of a semiconductor device according to an embodiment of the present invention.

In the following embodiment, as to the same or similar portions, repeated explanations thereof will be omitted in principle except where required.

Where required for convenience' sake, the following embodiment will each be described in a divided manner into plural sections or embodiments, but unless otherwise mentioned, they are not unrelated to each other, but are in a relation such that one is a modification or a detailed or supplementary explanation of part or the whole of the other.

In the following embodiment, when reference is made to the number of elements (including the number, numerical value, quantity and range), no limitation is made to the number referred to, but numerals above and below the number referred to will do as well unless otherwise mentioned and except the case where it is basically evident that limitation is made to the number referred to.

An embodiment of the present invention will be described in detail hereinunder on the basis of the accompanying drawings. In all of the drawings for illustrating the embodiments, portions having the same functions are identified by the same reference numerals, and repeated explanations thereof will be omitted.

(Embodiment)

Figure 2:
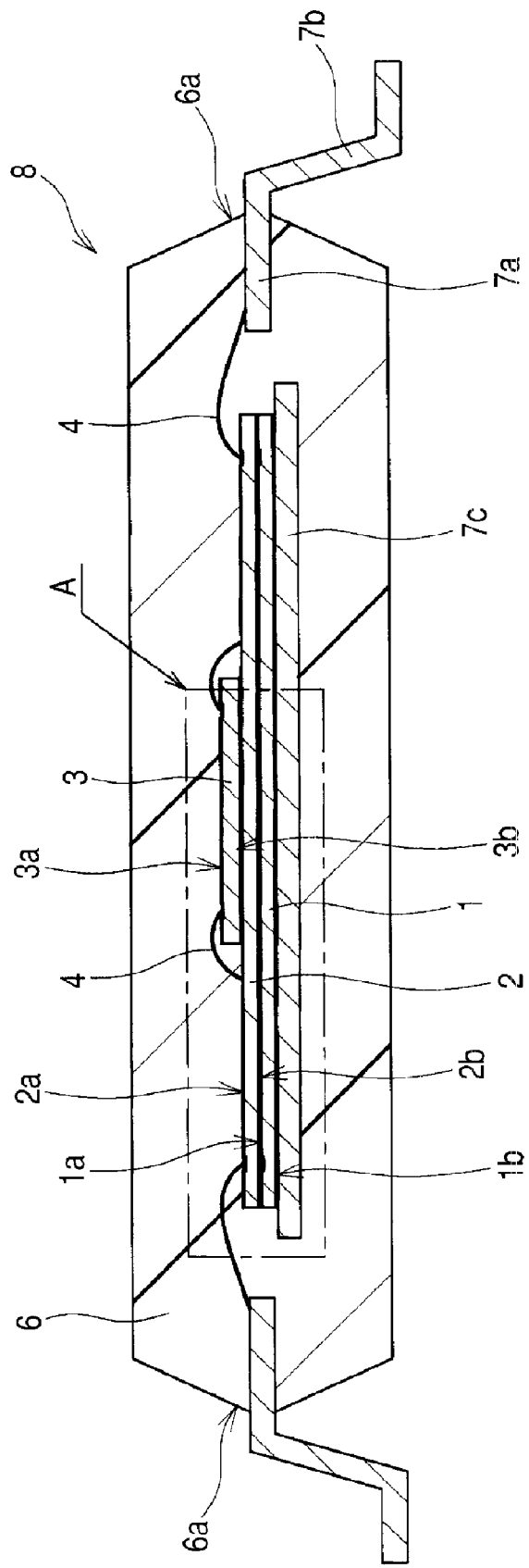
FIG. 2 is a sectional view taken along line A-A in FIG. 1, showing a structural example.
Figure 3:
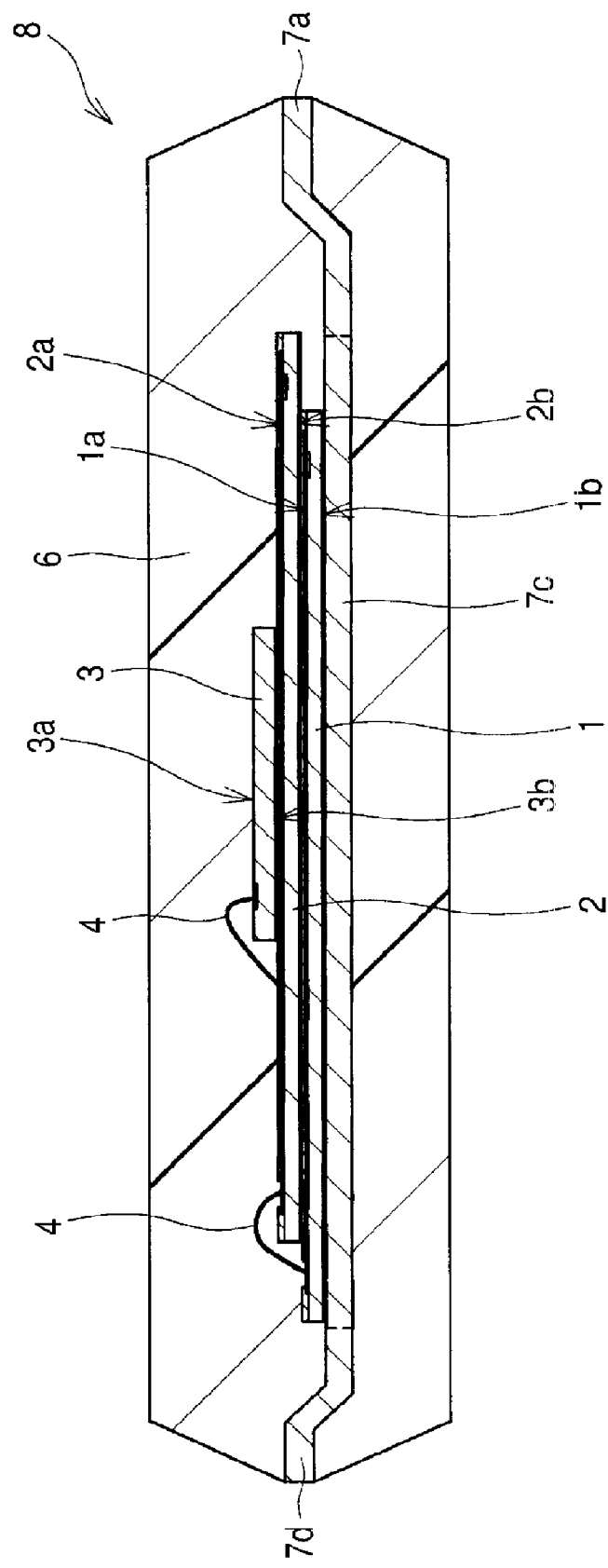
FIG. 3 is a sectional view taken along line B-B in FIG. 1, showing a structural example.
Figure 4:
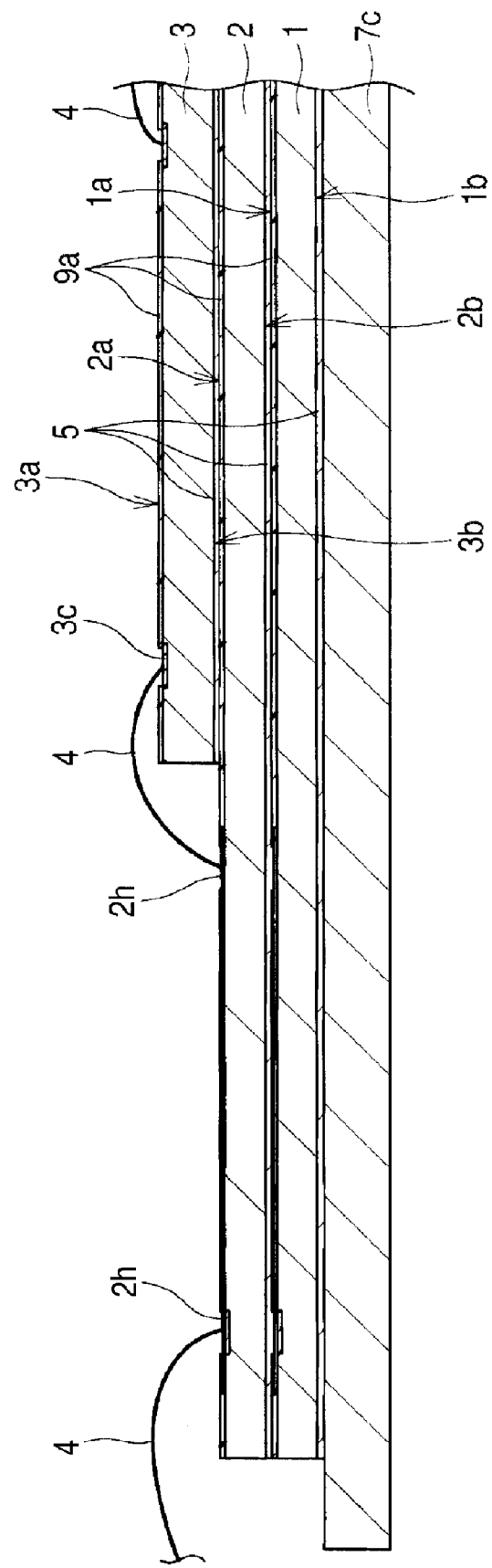
FIG. 4 is an enlarged sectional view showing on a larger scale a structural example of a portion A in FIG. 2.
Figure 5:
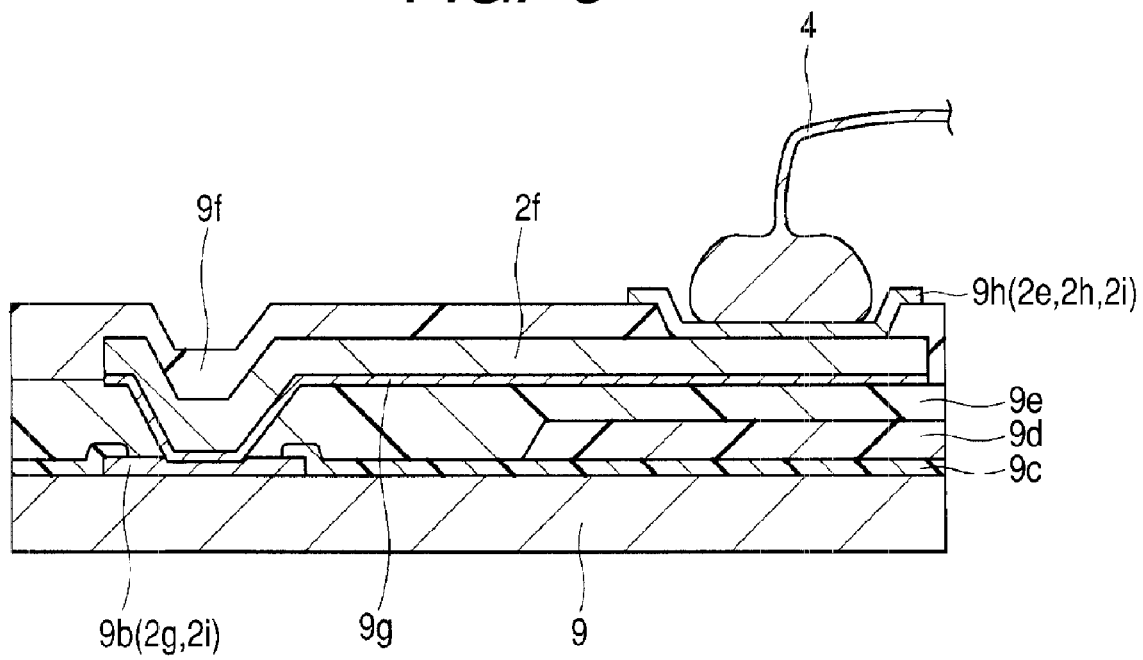
FIG. 5 is an enlarged sectional view showing on a larger scale a structural example of a re-wiring portion in memory chips of the semiconductor device shown in FIG. 1.
Figure 6:
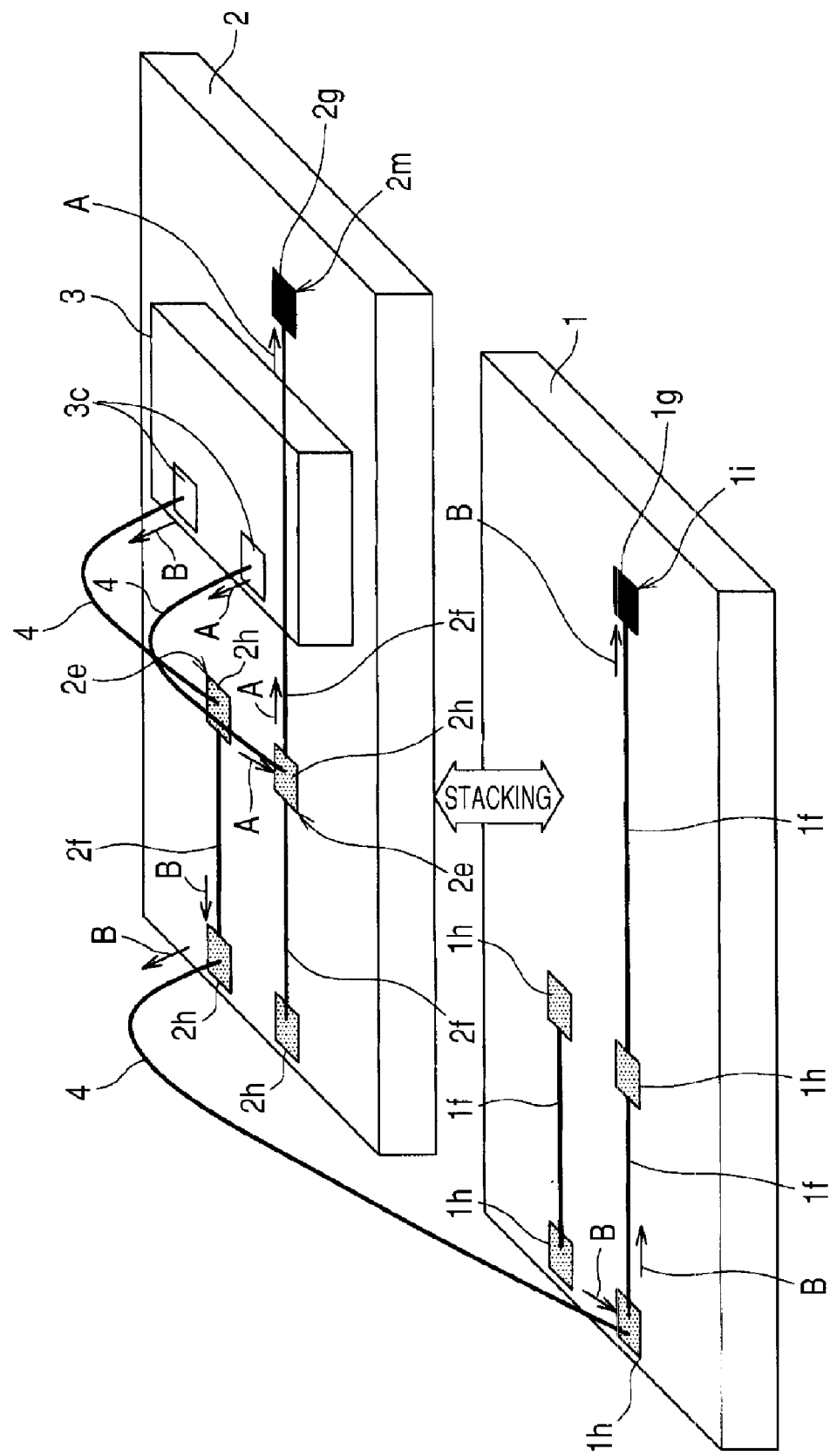
FIG. 6 is a perspective view showing an example of a state of coupling between upper and lower memory chips through lead-out wiring lines at chip intrinsic signal pads in the semiconductor device of FIG. 1.
Figure 7:
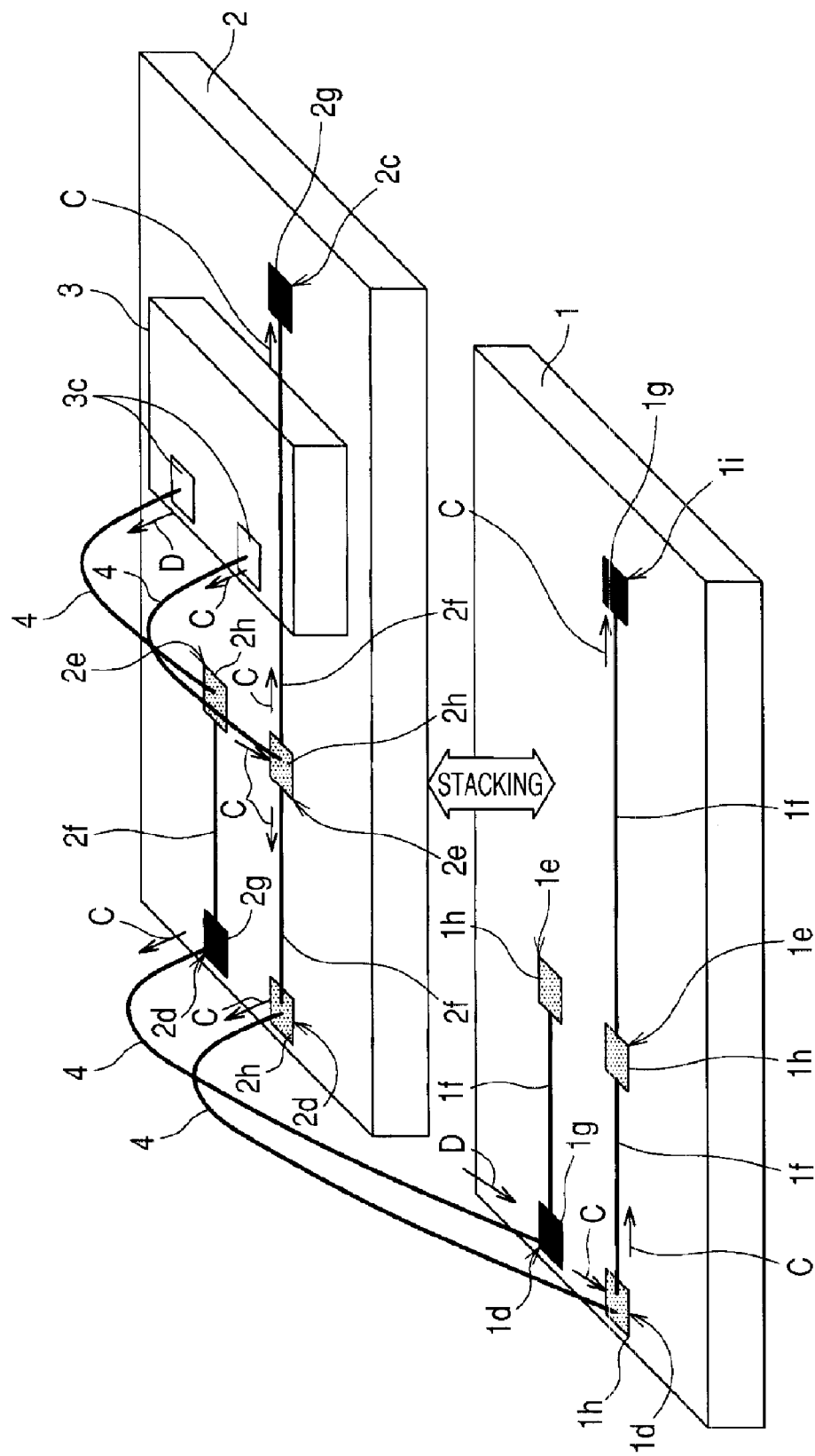
FIG. 7 is a perspective view showing an example of a state of coupling between upper and lower memory chips through lead-out wiring lines at chip common signal pads in the semiconductor device of FIG. 1.
Figure 8:
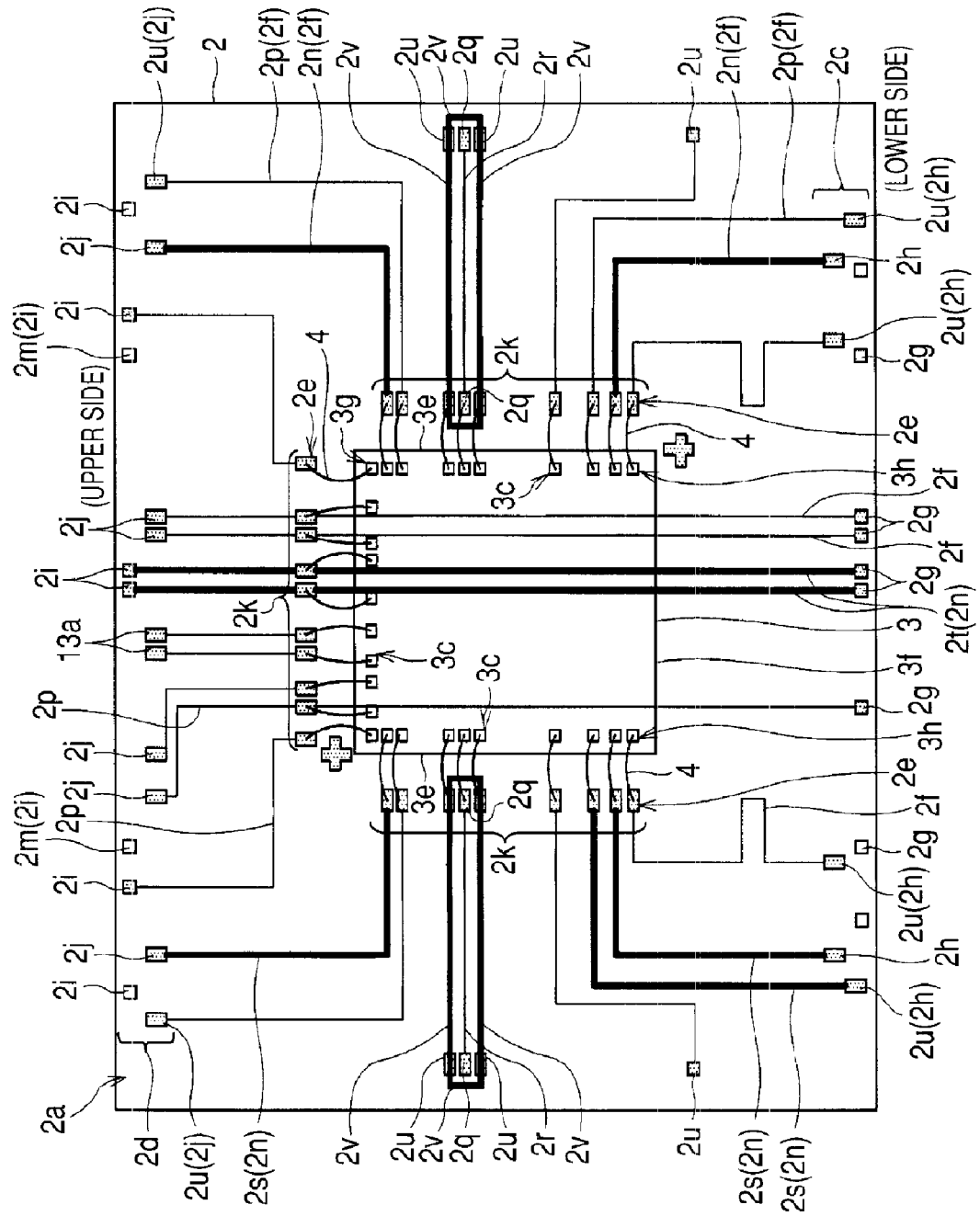
FIG. 8 is a wiring diagram showing an example of distribution of lead-out wiring lines in a memory chip mounted on the semiconductor device of FIG. 1 and an example of wiring between the memory chip and a microcomputer chip.

FIG. 1 is a plan view showing a structural example of a semiconductor device according to an embodiment of the present invention, FIG. 2 is a sectional view taken along line A-A in FIG. 2, showing a structural example, FIG. 3 is a sectional view taken along line B-B in FIG. 1, showing a structural example, FIG. 4 is an enlarged sectional view showing on a larger scale a structural example of a portion indicated at A in FIG. 2, FIG. 5 is an enlarged sectional view showing on a larger scale a structural example of a re-wiring portion in memory chips of the semiconductor device shown in FIG. 1, FIG. 6 is a perspective view showing an example of a state of coupling between upper and lower memory chips through lead-out wiring lines at chip intrinsic signal pads in the semiconductor device of FIG. 1, and FIG. 7 is a perspective view showing an example of a state of coupling between upper and lower memory chips through lead-out wiring lines at chip common signal pads in the semiconductor device of FIG. 1. FIG. 8 is a wiring diagram showing an example of distribution of lead-out wiring lines in a memory chip mounted on the semiconductor device of FIG. 1 and FIG. 9 comprises a plan view and an enlarged plan view, showing an example of a positional relation in pad array between a microcomputer chip and a memory chip both mounted on the semiconductor device of FIG. 1.

Figure 10:
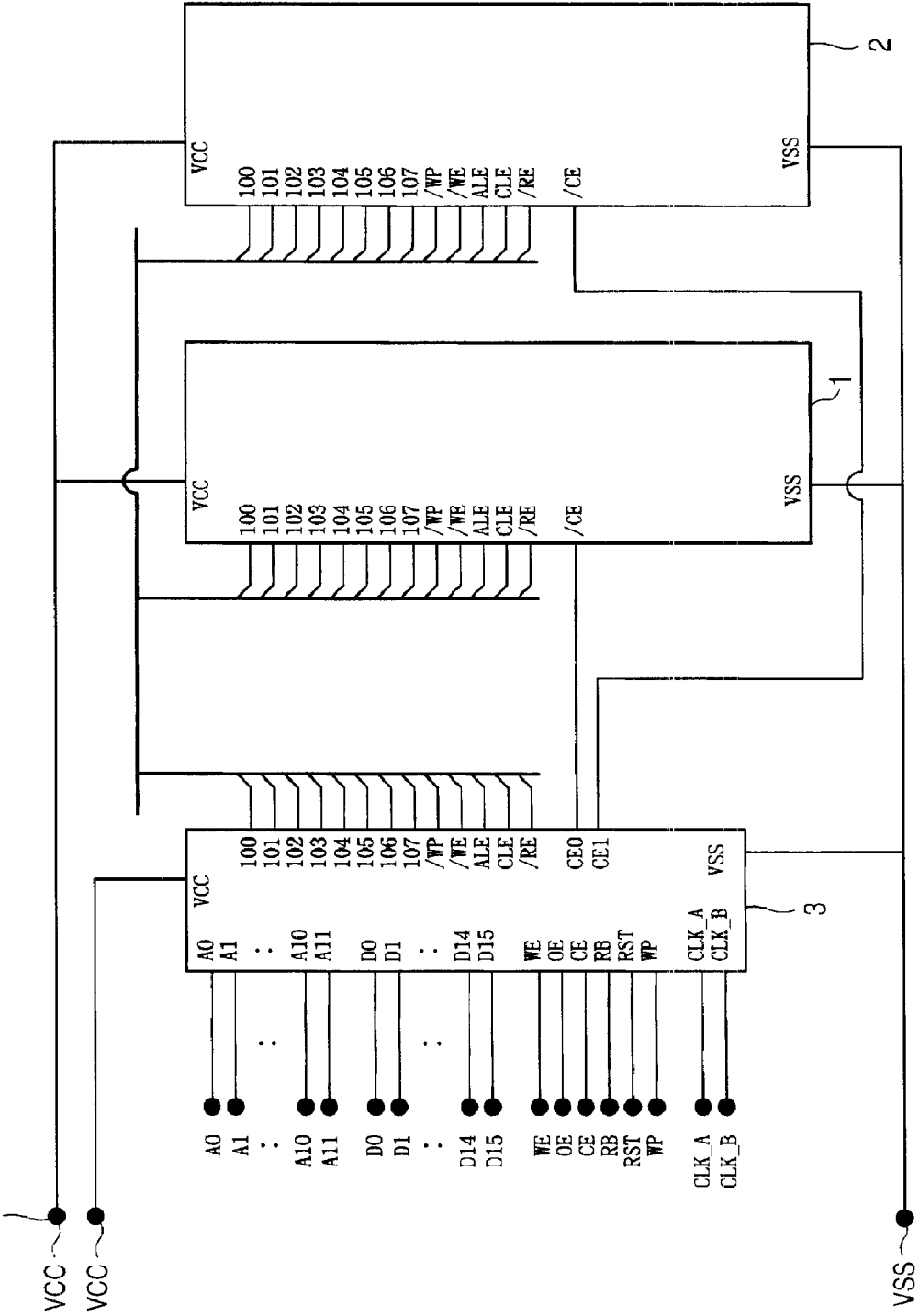
FIG. 10 is a block diagram showing an example of a state of coupling among memory chips, a microcomputer chip and external terminals in the semiconductor device of FIG. 1.
Figure 11:
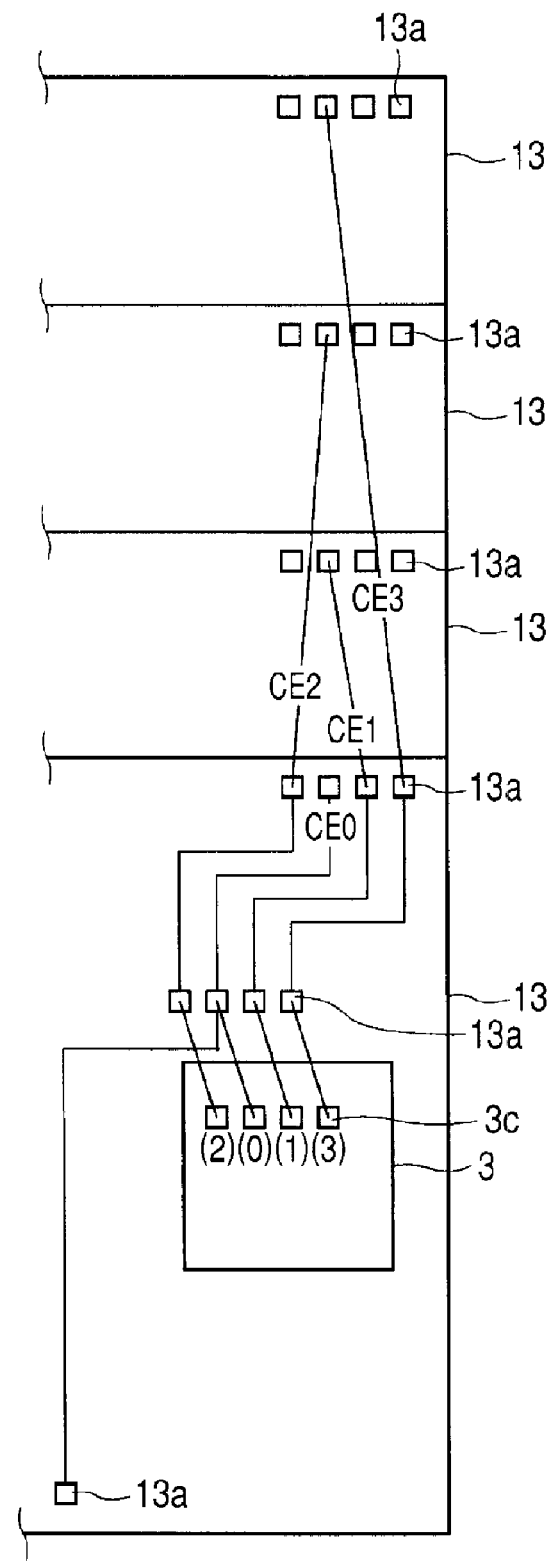
FIG. 11 is a wire coupling diagram showing an example of a wiring state of chip select pins in a stacked state at four stages of memory chips in the semiconductor device of FIG. 1.
Figure 12:
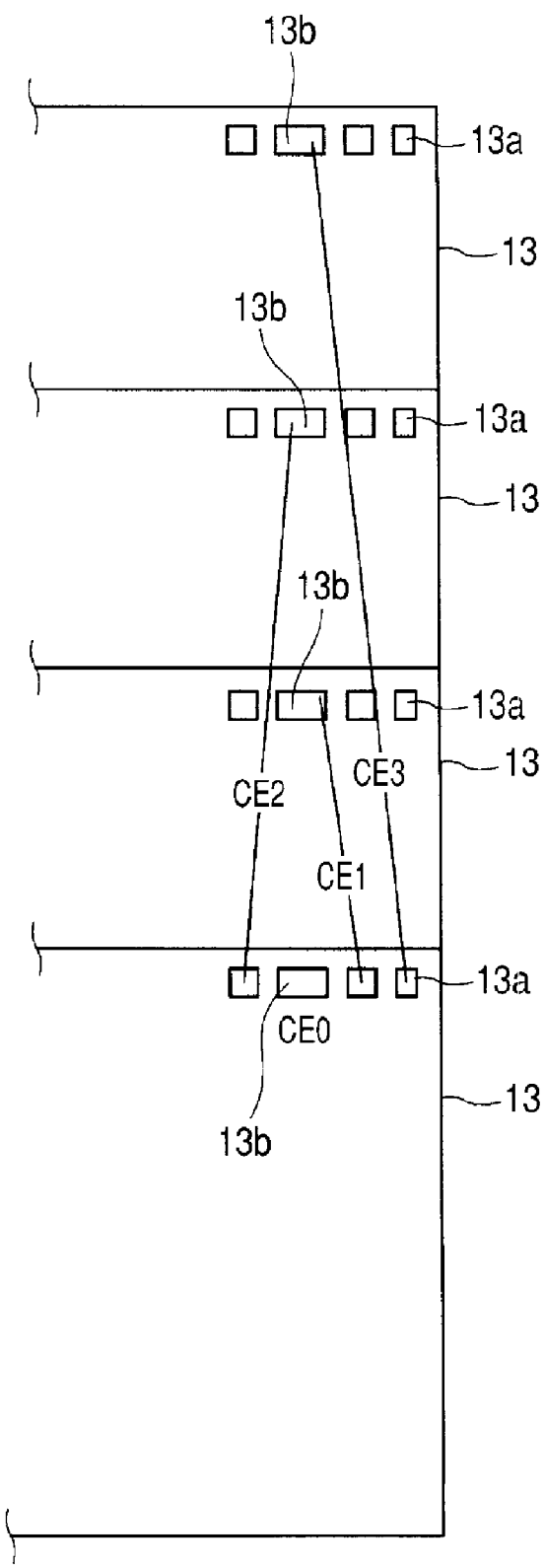
FIG. 12 is a wire coupling diagram according to a modification of FIG. 11.
Figure 13:
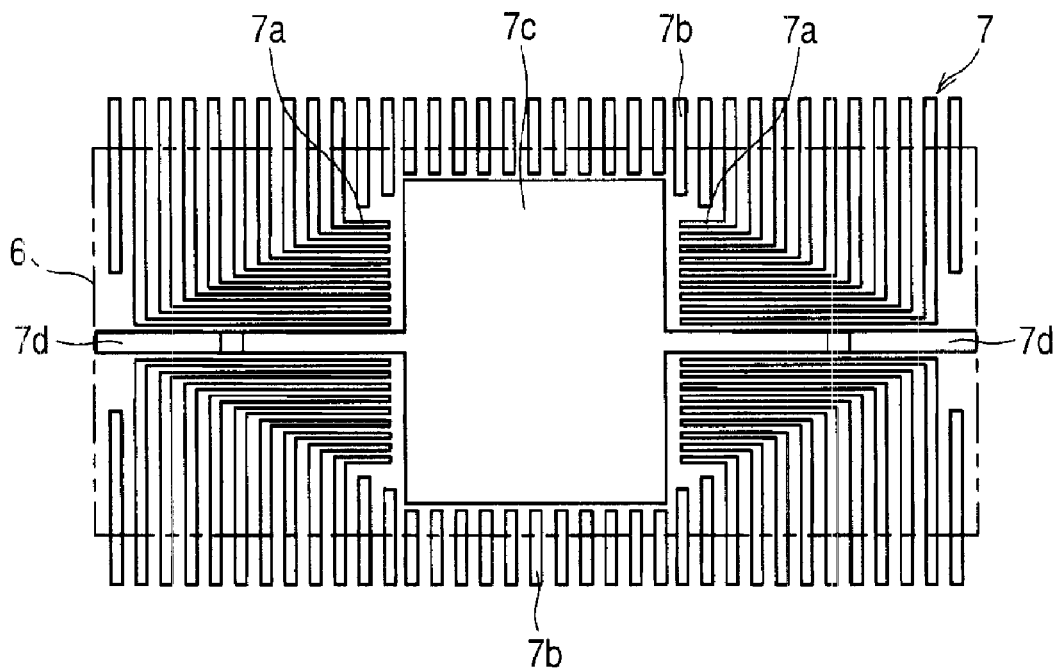
FIG. 13 is a plan view showing a structural example of a principal portion of a lead frame used in assembling the semiconductor device of FIG. 1.
Figure 14:
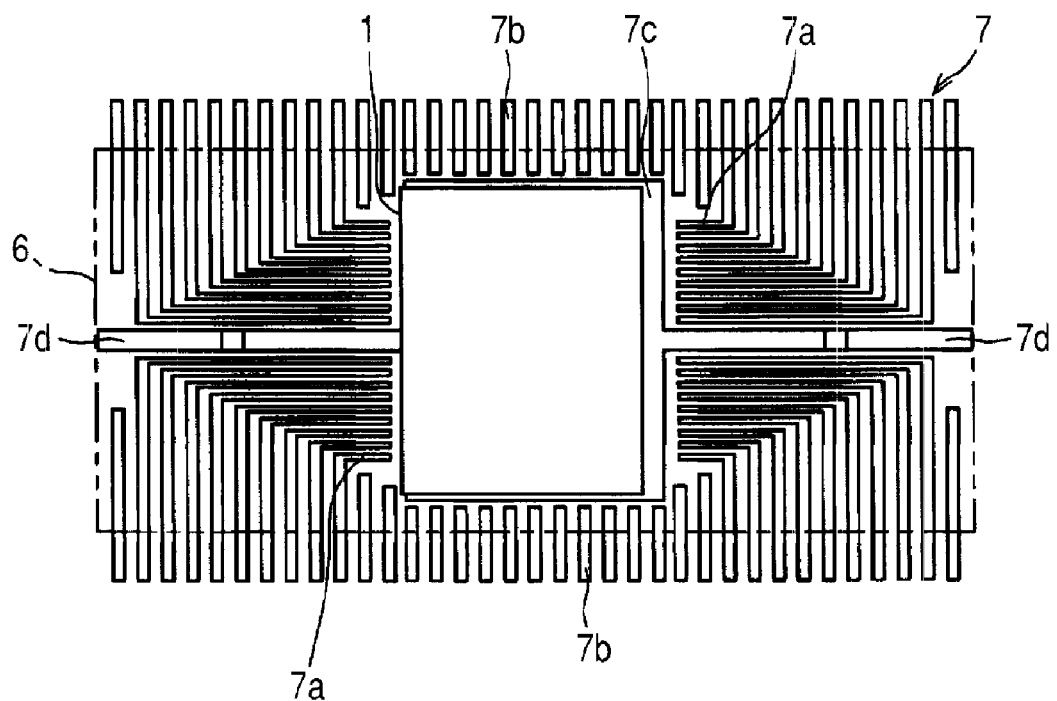
FIG. 14 is a plan view showing a structural example after mounting of the first-stage chip in assembling the semiconductor device of FIG. 1.
Figure 15:
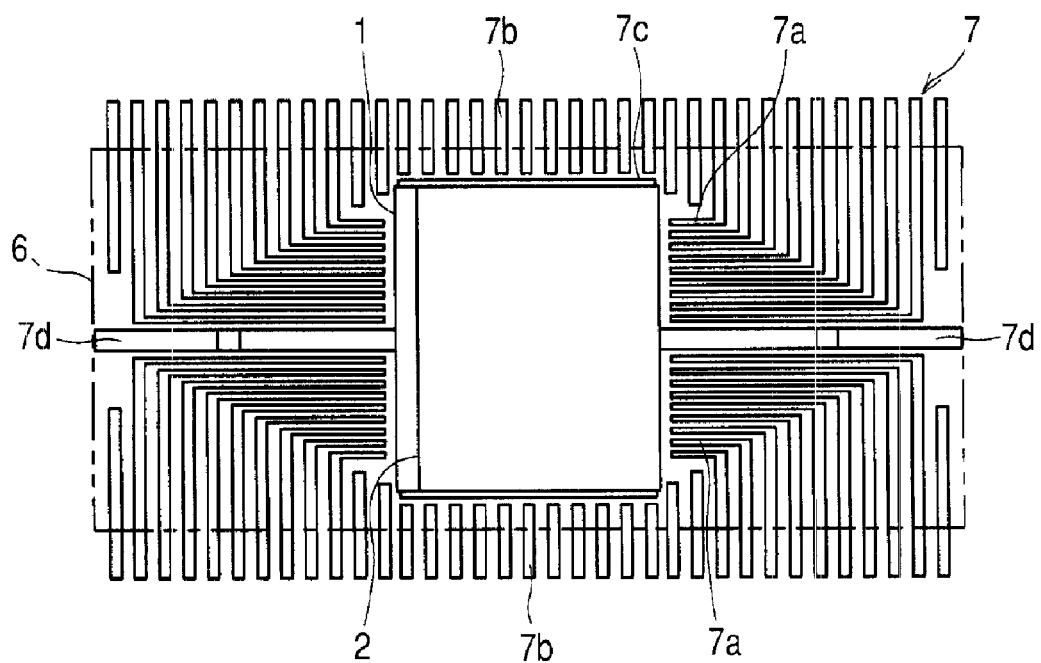
FIG. 15 is a plan view showing a structural example after mounting of the second-stage chip in assembling the semiconductor device of FIG. 1.
Figure 16:
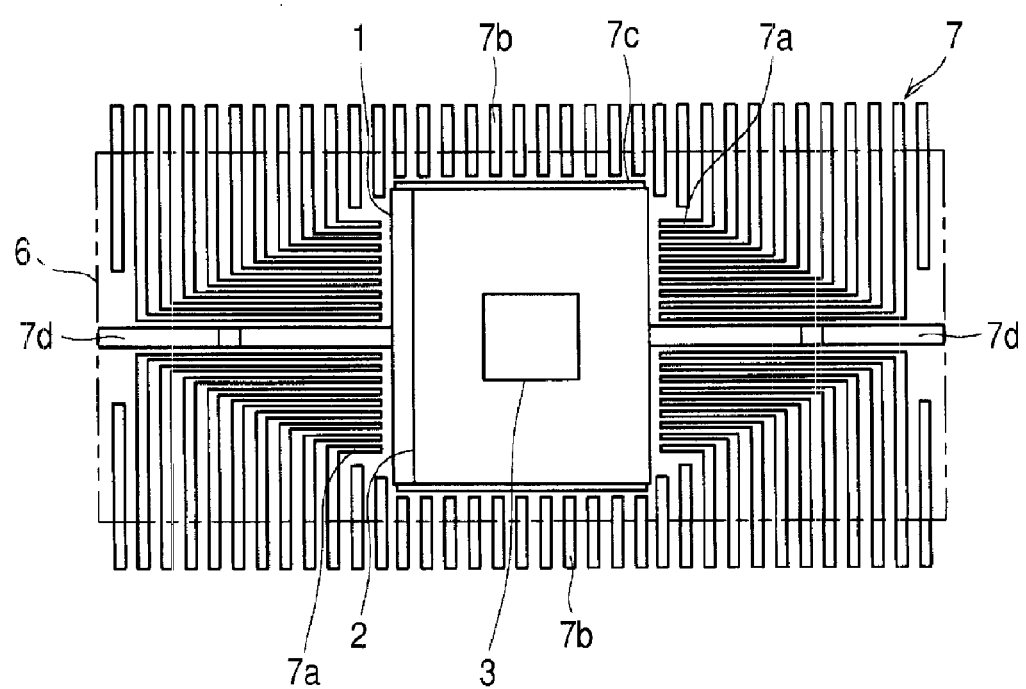
FIG. 16 is a plan view showing a structural example after mounting of the third-stage chip in assembling the semiconductor device of FIG. 1.

FIG. 10 is a block diagram showing an example of a state of coupling among memory chips, a microcomputer chip and external terminals in the semiconductor device of FIG. 1, FIG. 11 is a wire coupling diagram showing an example of a wiring state of chip select pins in a stacked state at four stages of memory chips in the semiconductor device of FIG. 1, FIG. 12 is a wire coupling diagram according to a modification of FIG. 11, FIG. 13 is a plan view showing a structural example of a principal portion of a lead frame used in assembling the semiconductor device of FIG. 1, FIG. 14 is a plan view showing a structural example after mounting of the first-stage chip in assembling the semiconductor device of FIG. 1, FIG. 15 is a plan view showing a structural example after mounting of the second-stage chip in assembling the semiconductor device of FIG. 1, and FIG. 16 is a plan view showing a structural example after mounting of the third-stage chip in assembling the semiconductor device of FIG. 1.

Figure 17:
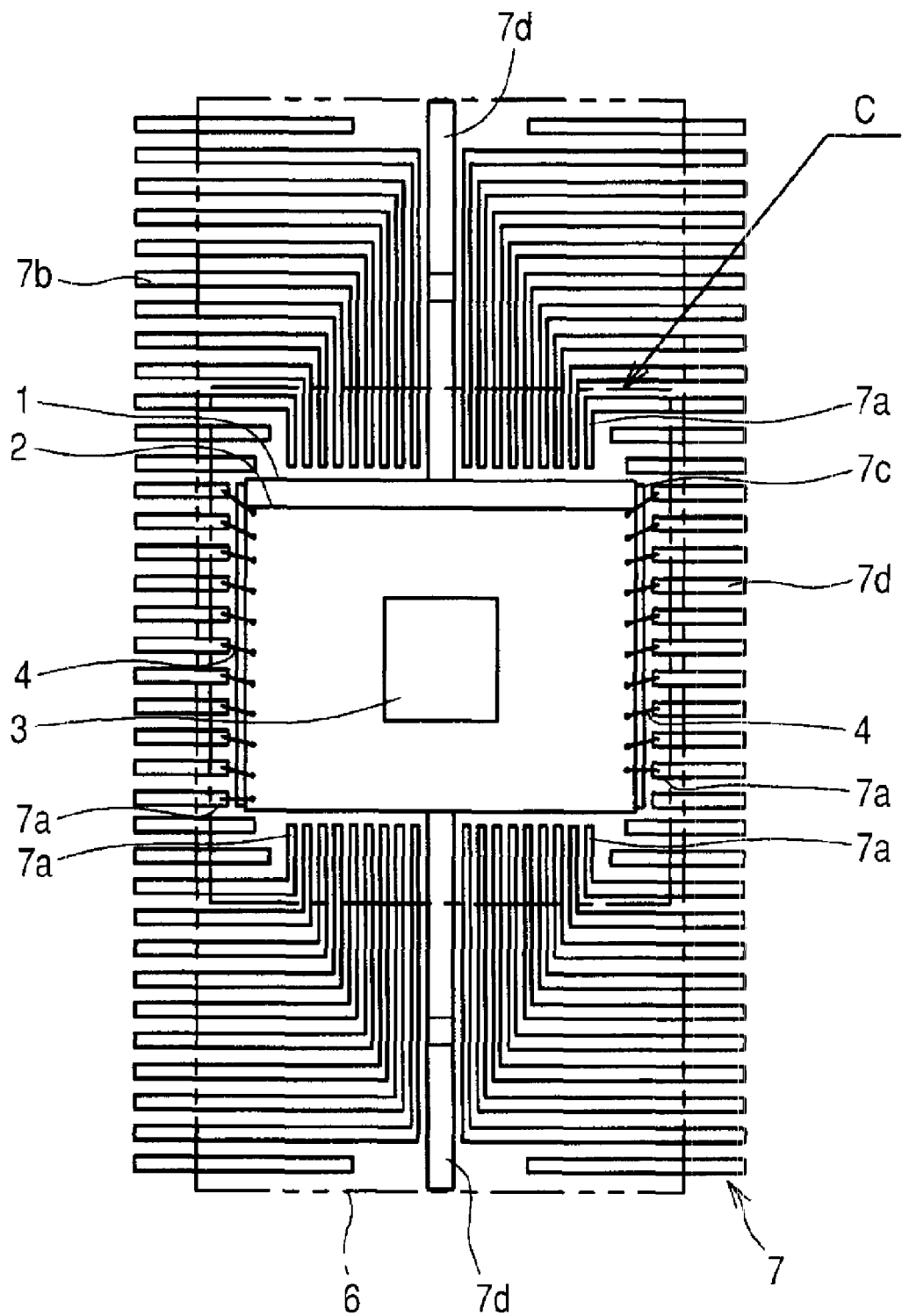
FIG. 17 is a plan view showing an example of a schematic structure after wire bonding in assembling the semiconductor device of FIG. 1.
Figure 18:
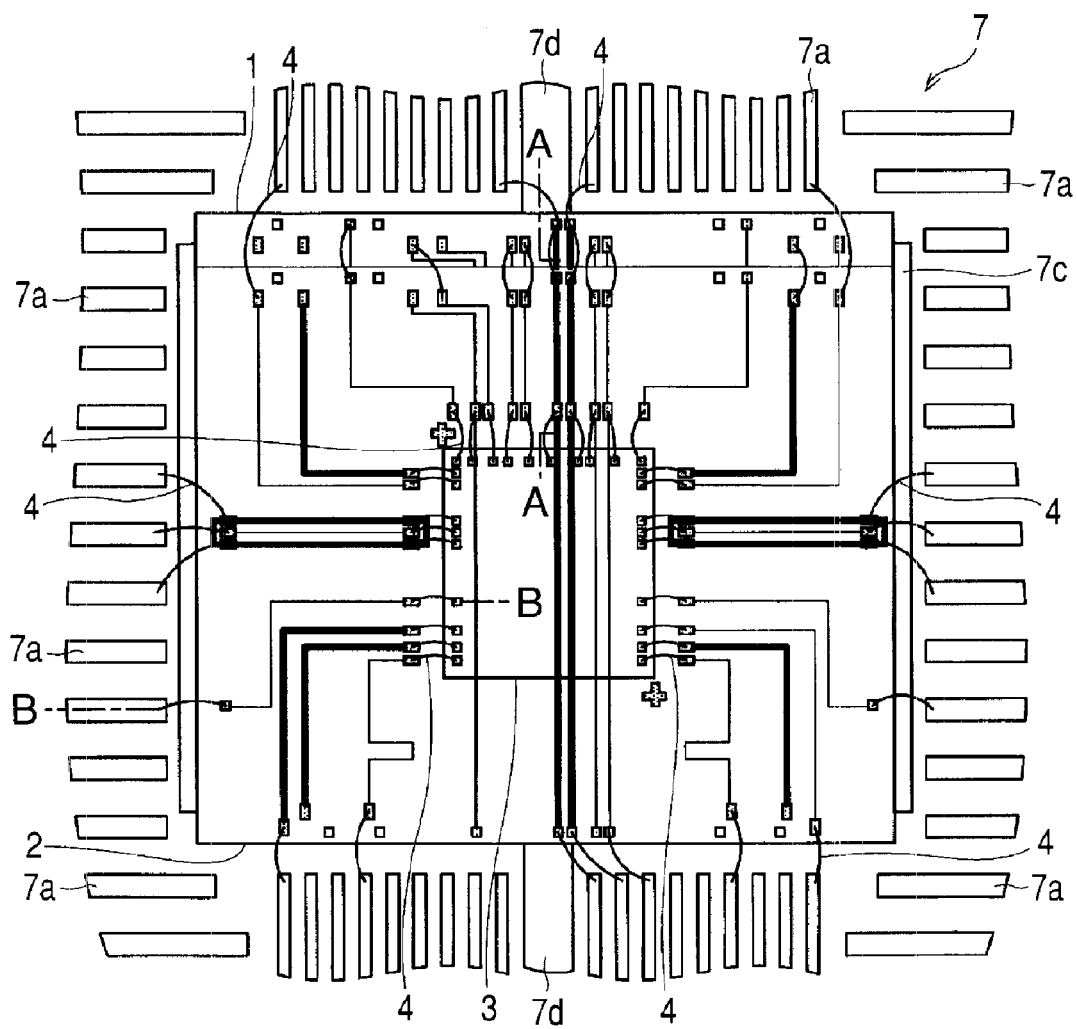
FIG. 18 is a partially enlarged plan view showing on a larger scale a structural example of a portion C in FIG. 17.
Figure 19:
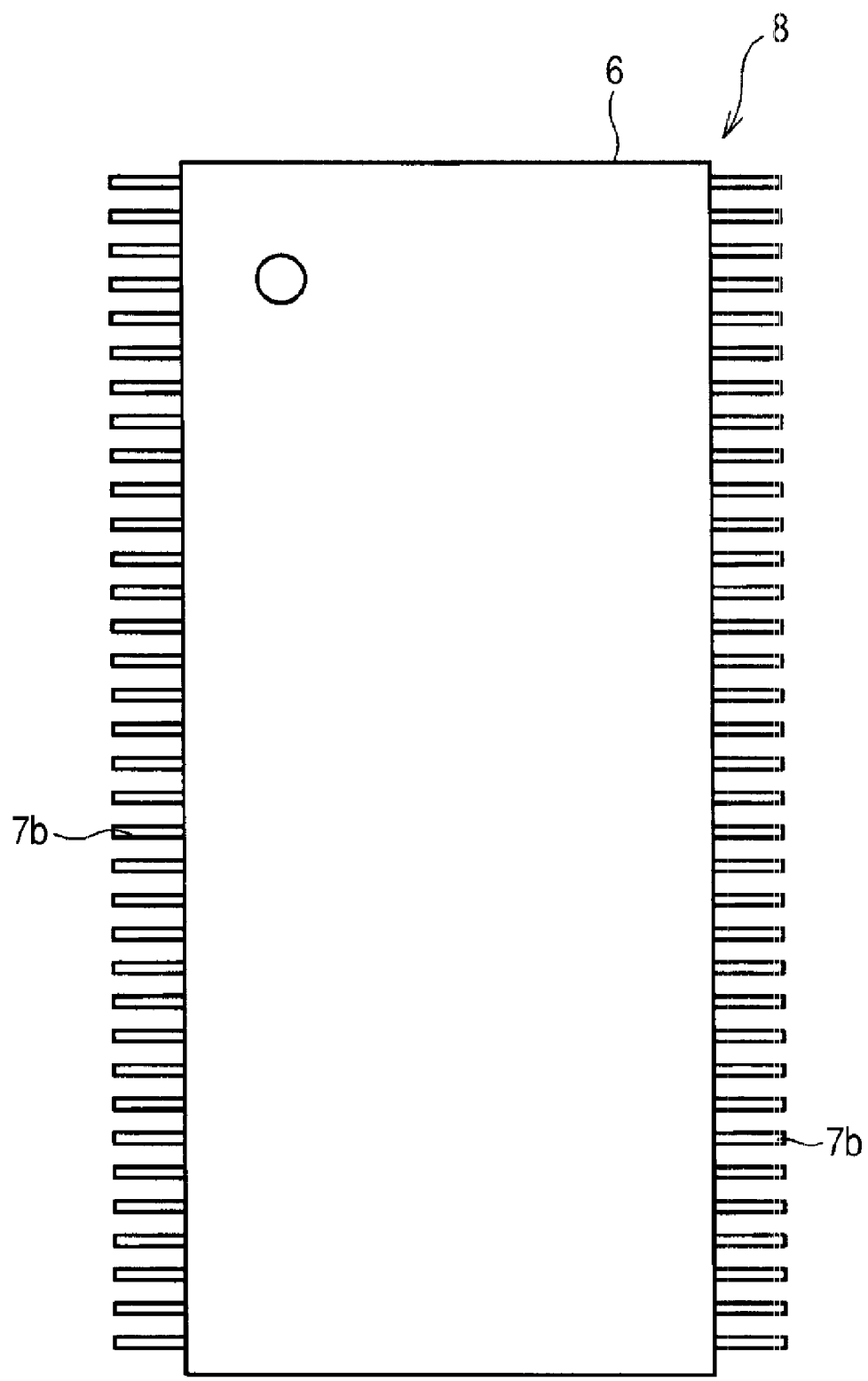
FIG. 19 is a plan view showing a structural example after resin molding in assembling the semiconductor device of FIG. 1.
Figure 20:
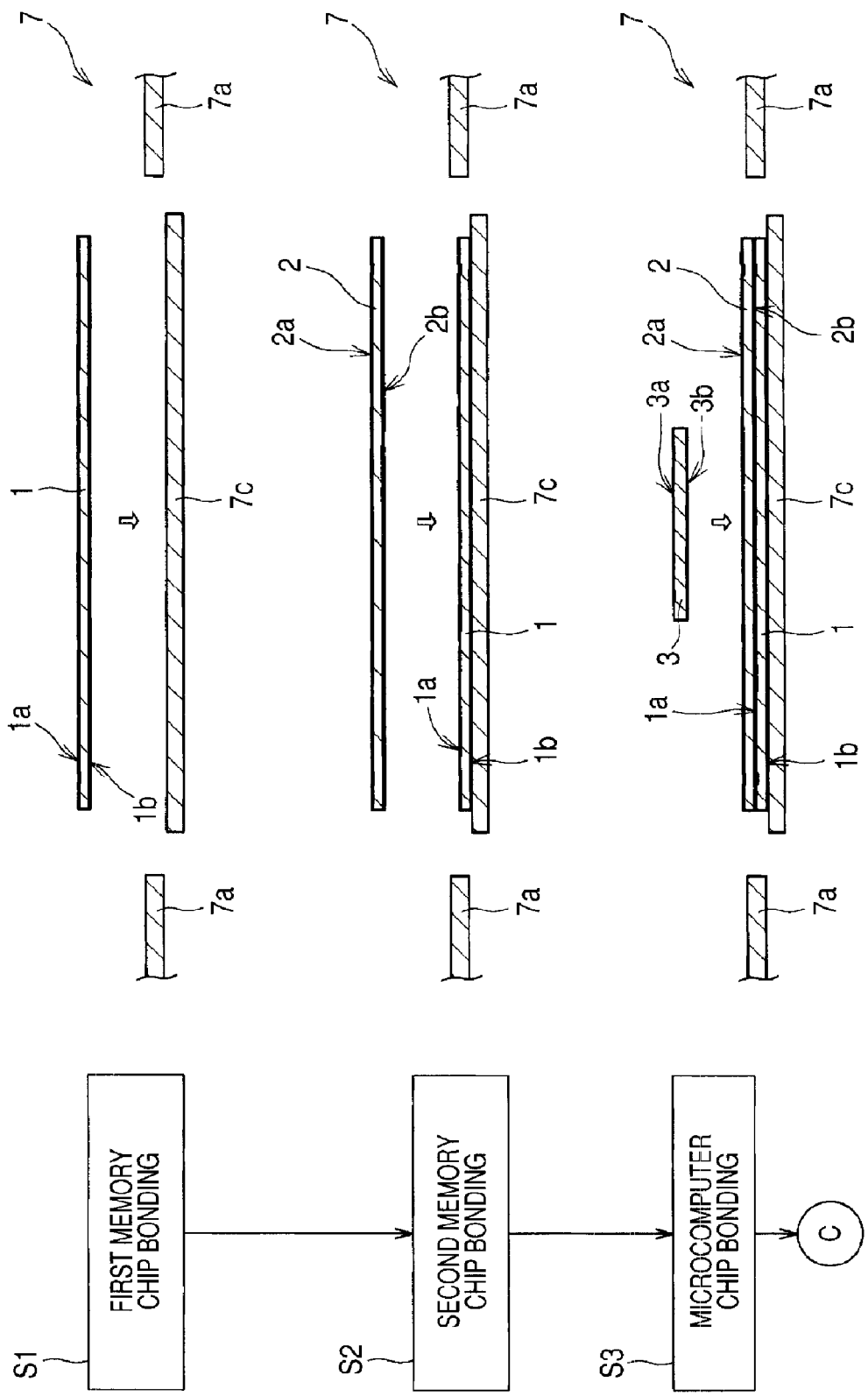
FIG. 20 is a sectional view in a package width direction, showing a structural example in chip mounting from the first- to third-stage chip in assembling the semiconductor device of FIG. 1.
Figure 21:
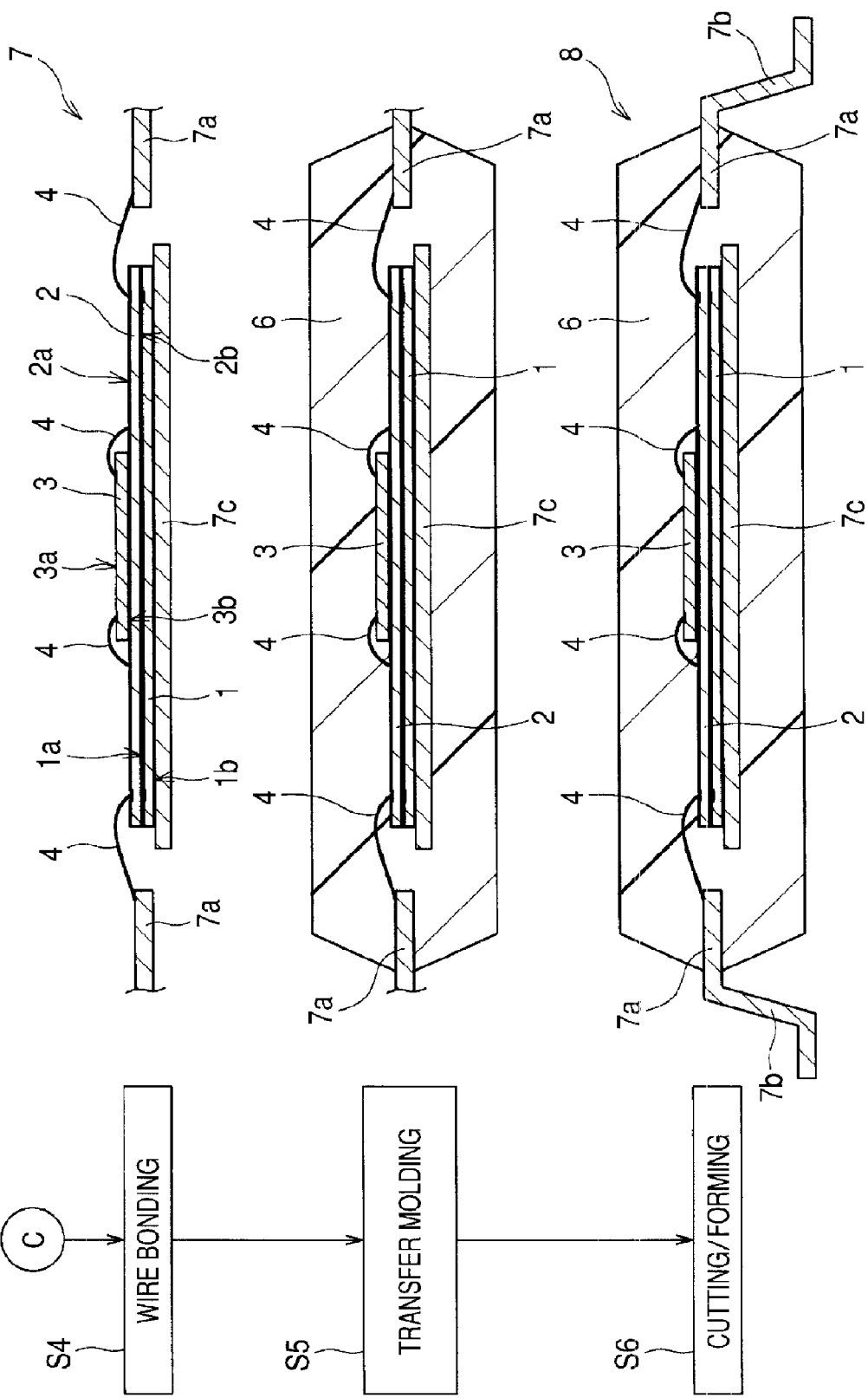
FIG. 21 is a sectional view in the package width direction, showing a structural example stepwise from wire bonding step to cutting/forming step in assembling the semiconductor device of FIG. 1.
Figure 22:
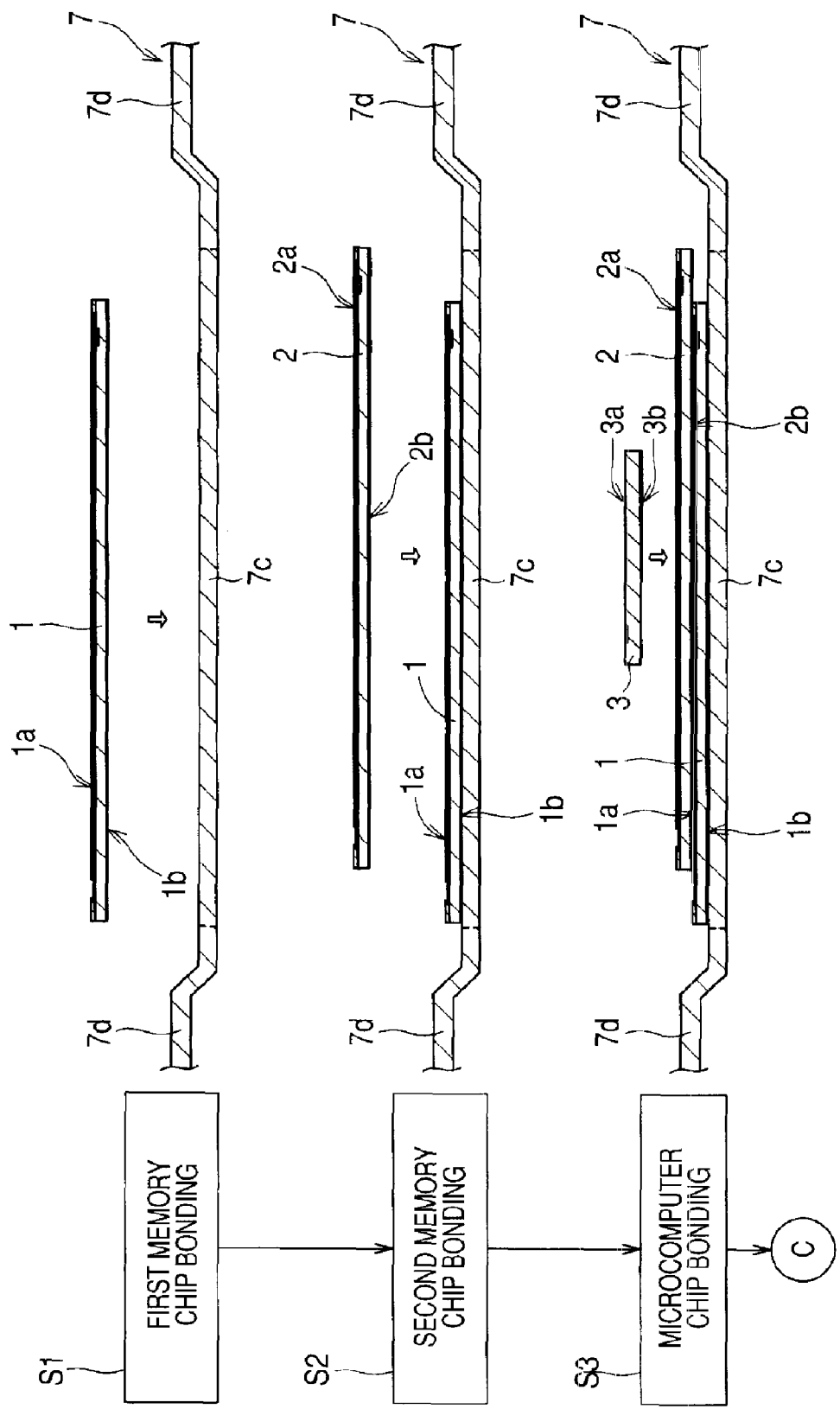
FIG. 22 is a sectional view in a package longitudinal direction, showing a structural example in chip mounting from the first- to third-stage chip in assembling the semiconductor device of FIG. 1.

FIG. 17 is a plan view showing an example of a schematic structure after wire bonding in assembling the semiconductor device of FIG. 1, FIG. 18 is a partially enlarged plan view showing on a larger scale a structural example of a portion C in FIG. 17, FIG. 19 is a plan view showing a structural example after resin molding in assembling the semiconductor device of FIG. 1, and FIG. 20 is a sectional view in a package width direction, showing a structural example in chip mounting from the first- to third-stage chip in assembling the semiconductor device of FIG. 1. FIG. 21 is a sectional view in the package width direction, showing a structural example stepwise from wire bonding step to cutting/forming step in assembling the semiconductor device of FIG. 1, FIG. 22 is a sectional view in a package longitudinal direction, showing a structural example in chip mounting from the first- to third-stage chip in assembling the semiconductor device of FIG. 1, and FIG. 23 is a sectional view in the package longitudinal direction, showing a structural example stepwise from wire bonding step to resin molding step in assembling the semiconductor device of FIG. 1.

Figure 24:
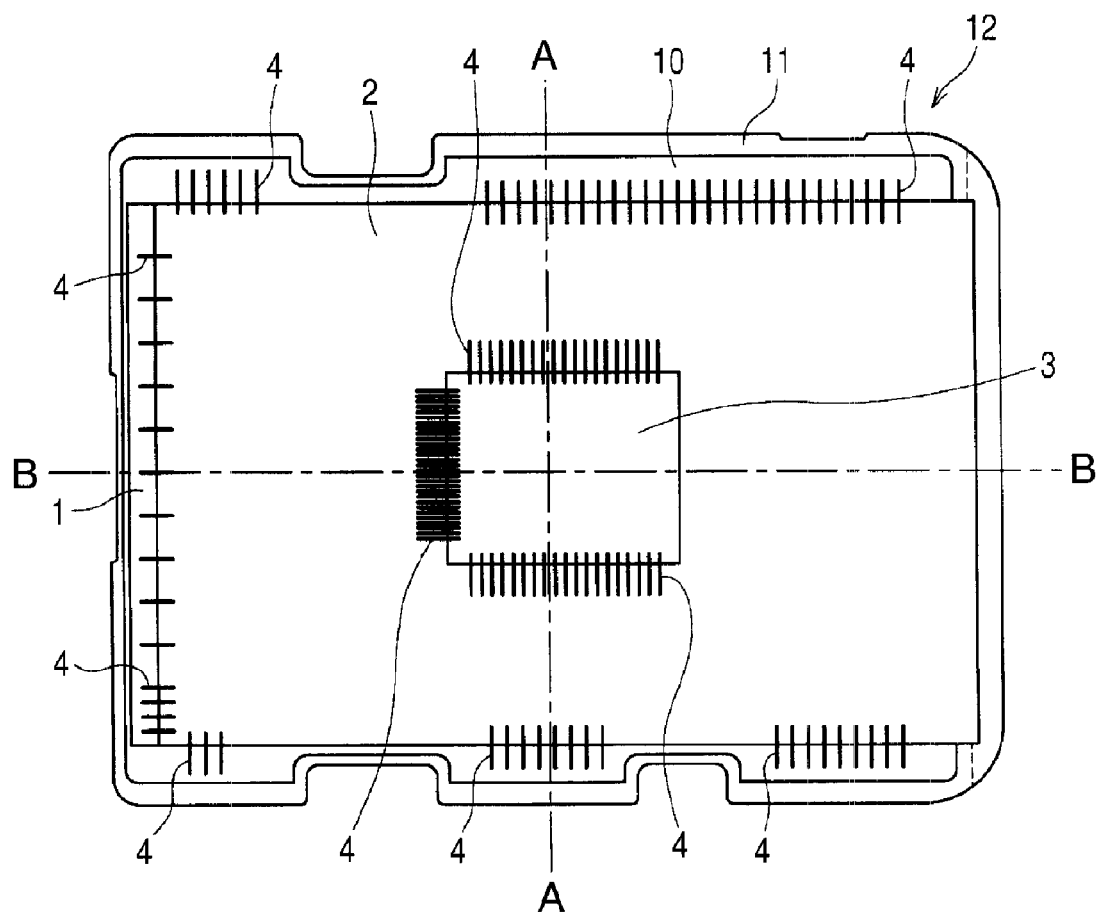
FIG. 24 is a plan view showing, in a see-through manner through a case, an internal structure of a semiconductor device (memory card) according to a modification of the embodiment.
Figure 25:
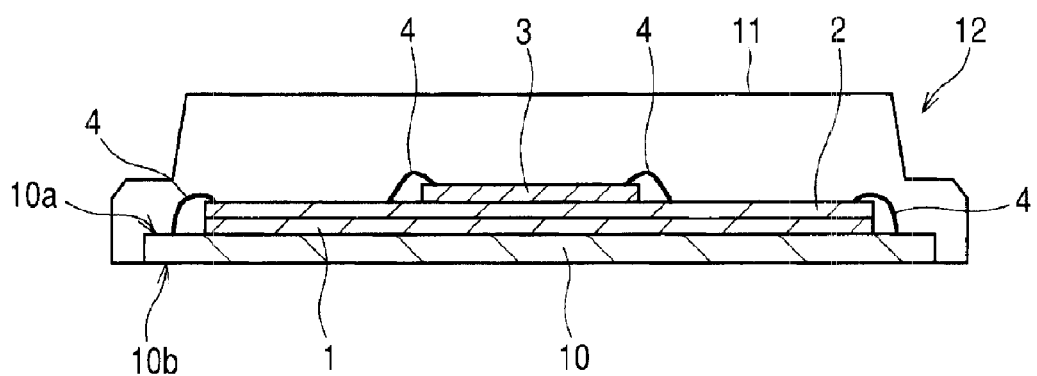
FIG. 25 is a sectional view taken along line A-A in FIG. 24, showing a structural example.
Figure 26:
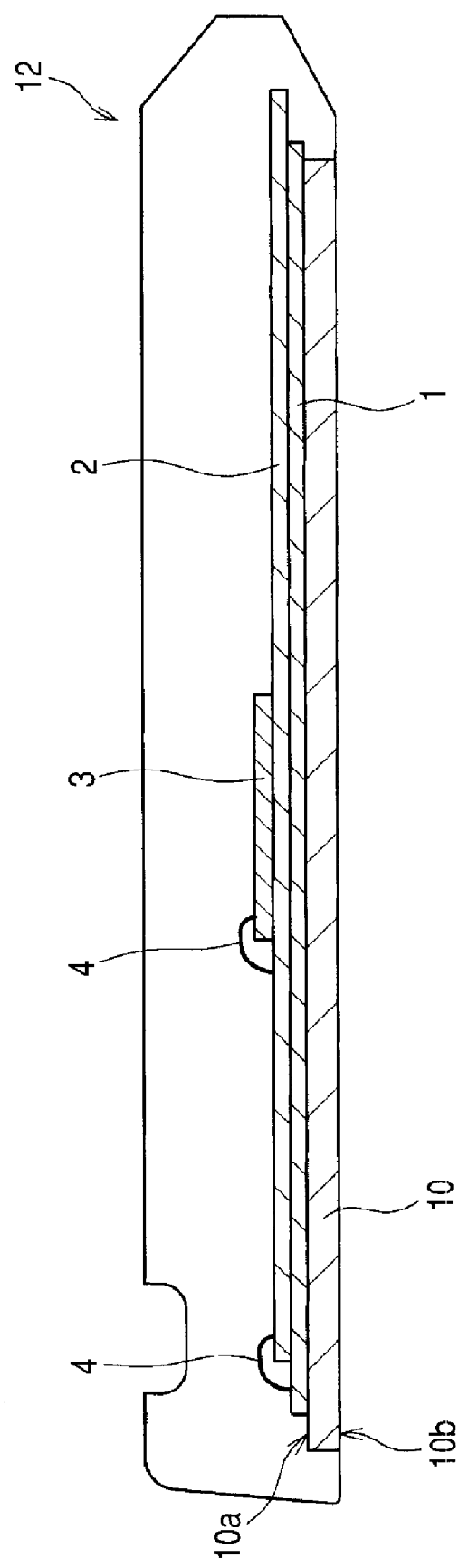
FIG. 26 is a sectional view taken along line B-B in FIG. 24, showing a structural example.
Figure 27:
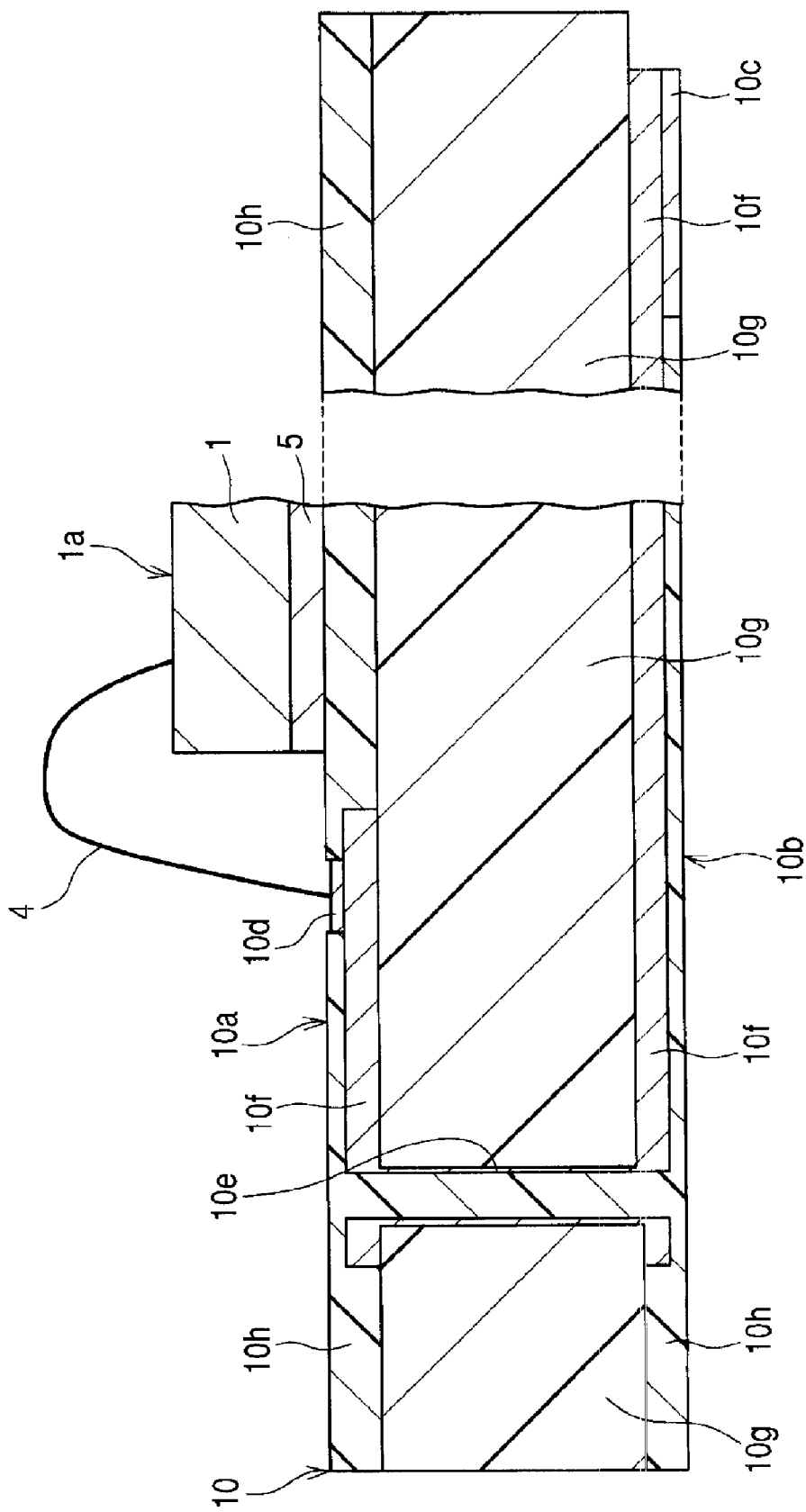
FIG. 27 is a partially enlarged sectional view showing a state of wire coupling between a memory chip and a substrate in the memory card of FIG. 24.
Figure 28:
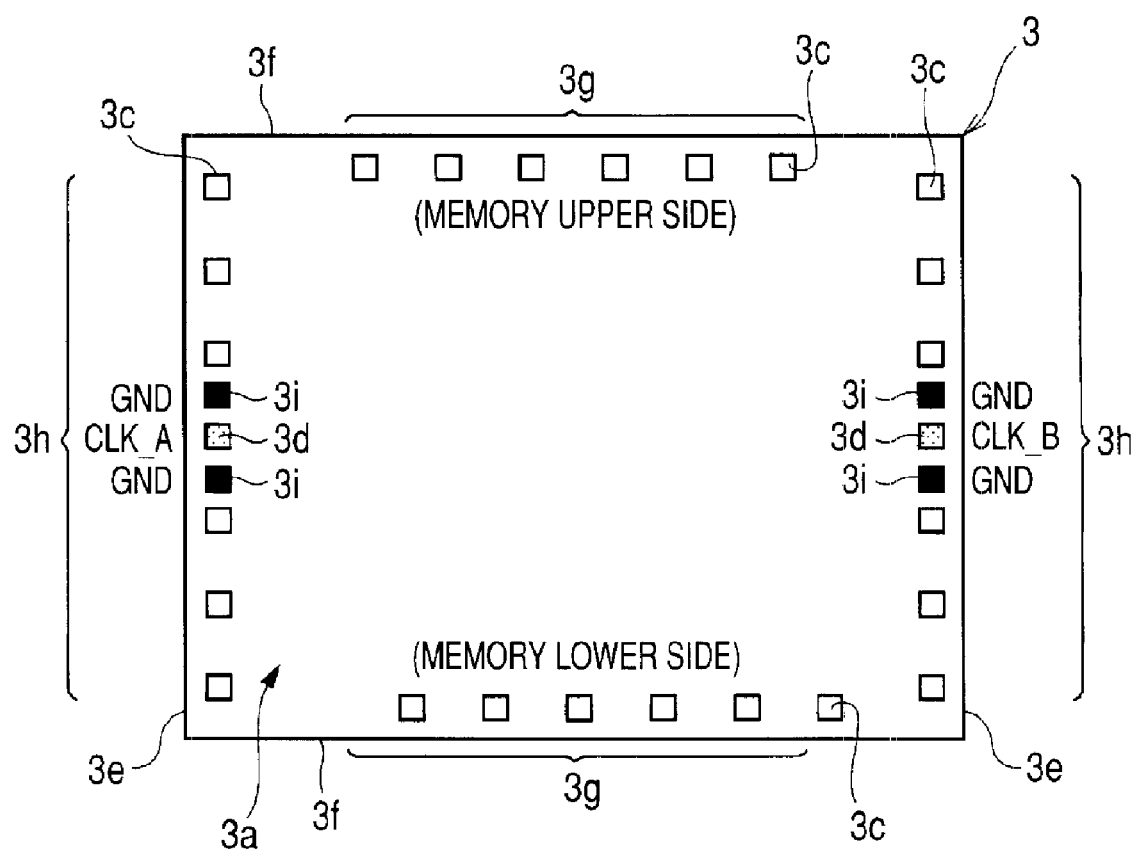
FIG. 28 is a plan view showing a pad array according to a modified example of the microcomputer chip used in the embodiment.
Figure 29:
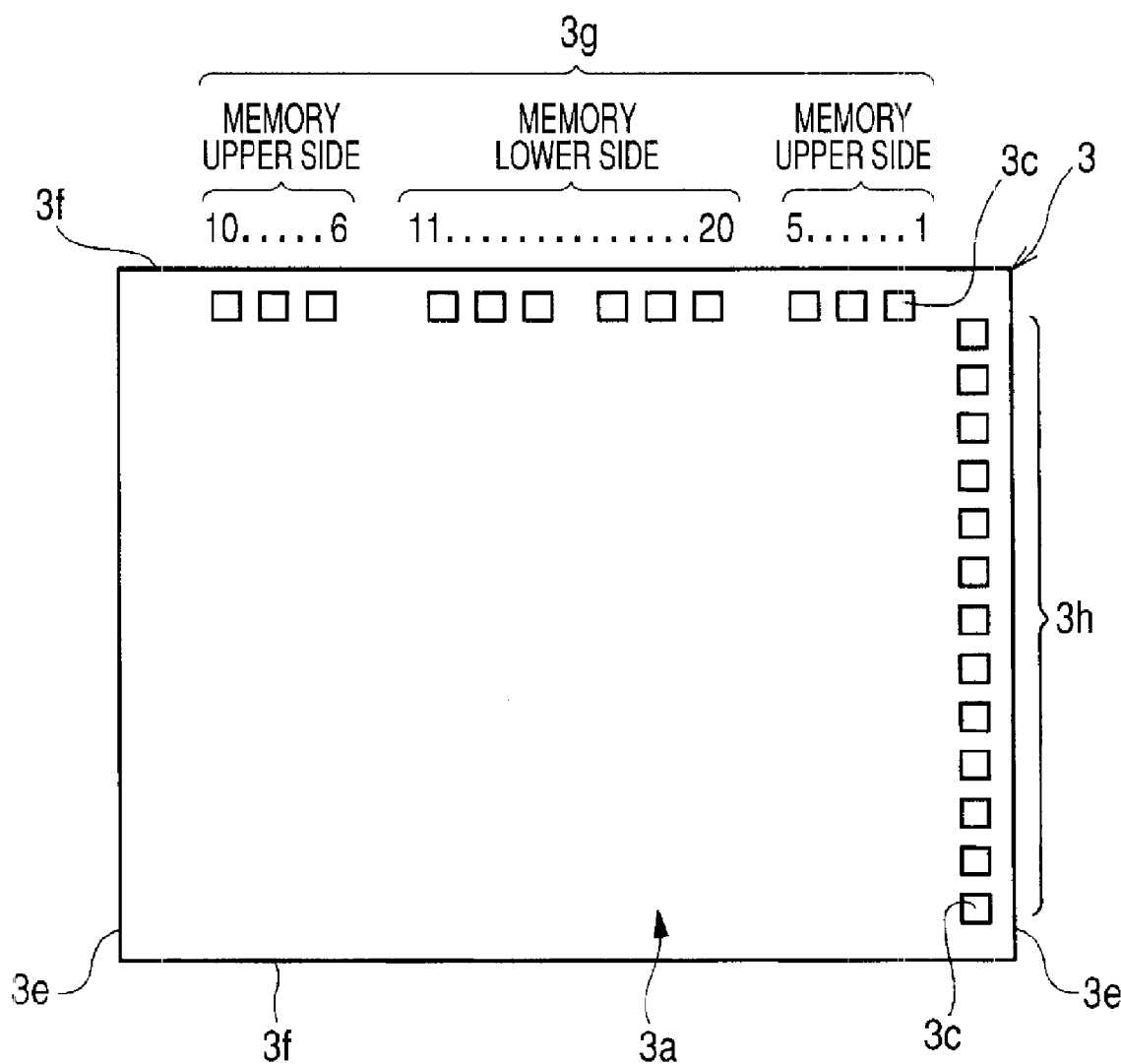
FIG. 29 is a plan view showing a pad array according to another modified example of the microcomputer chip used in the embodiment.

FIG. 24 is a plan view showing, in a see-through manner through a case, an internal structure of a semiconductor device (memory card) according to a modification of the embodiment, FIG. 25 is a sectional view taken along line A-A in FIG. 24, showing a structural example, FIG. 26 is a sectional view taken along line B-B in FIG. 24, showing a structural example, and FIG. 27 is a partially enlarged sectional view showing a state of wire coupling between a memory chip and a substrate in the memory card of FIG. 24. FIG. 28 is a plan view showing a pad array according to a modified example of the microcomputer chip used in the embodiment and FIG. 29 is a plan view showing a pad array according to another modified example of the semiconductor chip used in the embodiment.

The semiconductor device of this embodiment illustrated in FIGS. 1 to 3 is a semiconductor package of an SIP (System In Package) structure on which there are mounted plural memory chips and a microcomputer chip (also called a controller chip) for controlling the memory chips. In this embodiment, as an example of the semiconductor device, reference is made to an SSOP (Shrink Small Outline Package) 8 which is assembled using a lead frame as a metallic substrate (base member) and which is small-sized and is a resin-sealed type, with two memory chips and one microcomputer chip 3 stacked on a tab (die pad) 7c as a chip mounting portion.

That is, the SSOP 8 is of a structure wherein two memory chips are stacked on the tab 7c and one microcomputer chip 3 is further stacked thereon, and thus three semiconductor chips are stacked on the tab 7c.

A description will be given first about the entire configuration of the SSOP 8. A first memory chip 1 is mounted on the tab 7c, a second memory chip 2 is stacked on the first memory chip 1, and further the microcomputer chip 3 is stacked on the second memory chip 2. As shown in FIG. 13, plural inner leads (bonding leads) 7a serving as terminals respectively are arranged around the tab 7c, and as shown in FIG. 17, mainly pads (surface electrodes) of the second memory chip 2 as a second-stage memory chip and the inner leads 7a are coupled together electrically through wires 4. As shown in FIG. 18, certain pads (e.g., power supply pads) of the first memory chip 1 as a first-stage memory chip are also coupled electrically to the inner leads 7a through wires 4. In FIG. 18 the number of pads and that of re-wiring lines (lead-out wiring lines) are omitted. Further, re-wiring lines 2f provided on a back surface side of the microcomputer chip 3 are normally covered with the microcomputer chip 3 and cannot be seen, but in FIG. 18 they are shown in a transmitted state through the microcomputer chip 3 for explaining distribution of the re-wiring lines 2f.

In the microcomputer chip 3 as a third-stage chip, all of the pads thereof are coupled electrically to the pads of the second memory chip 2 through wires 4.

The inner leads 7a are respectively formed integrally with outer leads 7b. The outer leads 7b, which serve as terminals (external terminals) of the SSOP 8, are coupled electrically to the microcomputer chip 3 through the inner leads 7a and wires 4. As shown in FIGS. 1 and 2, the tab 7c, three semiconductor chips, wires 4 and inner leads 7a are sealed with a sealing body 6 formed of sealing resin. Plural outer leads 7b coupled respectively to the inner leads 7a are projecting from two opposed sides 6a of the sealing body 6. The outer leads 7b are formed as external terminals by bending in a gull wing shape.

Such metallic substrates (base members, plates) as tab 7c, inner leads 7a and outer leads 7b) are formed using, for example, copper alloy or iron-Ni alloy. The wires 4 are, for example, gold wires and the sealing body 6 is formed of, for example, a thermosetting epoxy resin.

The first memory chip 1, second memory chip 2 and microcomputer chip 3 are formed of silicon for example and are each quadrangular in plane shape intersecting the thickness, which plane shape is rectangular in this embodiment. As shown in FIG. 4, the first memory chip 1, second memory chip 2 and microcomputer chip 3 are stacked by face up bonding through an adhesive 5 so as to permit wire bonding.

More specifically, the first memory chip 1 is mounted on the tab 7c through the adhesive 5 so that a pads-formed main surface 1a thereof faces up (so that a back surface 1b opposite to the main surface 1a of the first memory chip 1 confronts the tab 7c). The tab 7c and the back surface 1b of the first memory chip 1 are bonded together through the adhesive 5. In short, the first memory chip 1 is face-up-mounted on the tab 7c.

The second memory chip 2 is stacked on the main surface 1a of the first memory chip 1 through the adhesive 5 so that a pads-formed main surface 2a thereof faces up (so that a back surface 2b opposite to the main surface 2a of the second memory chip 2 confronts the main surface 1a of the first memory chip 1). The main surface 1a of the first memory chip 1 and the back surface 2b of the second memory chip 2 are bonded together through the adhesive 5. The second memory chip 2 is mounted on the first memory chip 1 with its center offset from the center of the first memory chip 1 so that one side (one end portion) of the first memory chip 1 is exposed. The second memory chip 2 is mounted on the first memory chip 1 so that the sides of the second memory chip 2 stand side by side with the sides of the first memory chip 1. In short, the second memory chip 2 is face-up-mounted on the main surface 1a of the first memory chip 1.

The microcomputer chip 3 is stacked on the main surface 2a of the second memory chip 2 through the adhesive 5 so that a pads-formed main surface 3a thereof faces up (so that a back surface 3b opposite to the main surface 3a of the microcomputer chip 3 confronts the main surface 2a of the second memory chip 2). The main surface 2a of the second memory chip 2 and the back surface 3b of the microcomputer chip 3 are bonded together through the adhesive 5. The microcomputer chip 3 is mounted on the second memory chip 2 so as to be positioned inside (on the center side) the sides of the second memory chip 2 and so that the sides thereof stand side by side with the sides of the second memory chip 2. In short, the microcomputer chip 3 is face-up-mounted on the main surface 2a of the second memory chip 2.

As shown in FIG. 4, an insulating film 9a is formed on each of the main surfaces 1a, 2a and 3a of the first memory chip 1, second memory chip 2 and microcomputer chip 3.

In the SSOP 8 of this embodiment, the same wiring pattern is formed on each of stacked plural memory chips. That is, in the SSOP 8, the same wiring patterns and pads are formed on the main surfaces 1a and 2a of the first and second memory chips 1, 2. In short, in this embodiment, the second memory chip 2 is of the same type (outline size, function, capacity) as the first memory chip 1. A concrete wiring pattern formed on each of the memory chips will be explained below with reference to the second memory chip 2 as an example.

As shown in FIG. 8, plural pads are formed along the sides of the main surface 2a of the second memory chip 2. These pads include plural pads (end pads for the microcomputer chip) 2u arranged along the sides (short and long sides) for electrical coupling between the microcomputer chip 3 and an external device (LSI positioned outside the system comprised of the microcomputer chip and the memory chips), plural pads (first pads) 2c formed along one (lower side in FIG. 8) of two sides (long sides) intersecting short sides and confronting each other, and plural pads (second pads) 2d formed along the other side (long side, upper side in FIG. 8).

The first pads 2c are arranged in two rows along the lower side (long side) of the second memory chip and are comprised of plural original pads 2g arranged in the first row close to the lower side and plural relocation pads (end pads 2u for microcomputer chip) 2h arranged in the second row farther from the lower side than the first row. Like the first pads 2c, the second pads 2d are also arranged in two rows along the upper side (long side) of the second memory chip and are comprised of plural original pads 2i arranged in the first row close to the upper side and plural relocation pads 2j arranged in the second row farther from the lower side than the first row.

Re-wiring lines 2f formed on the back surface side of the microcomputer chip 3 are covered with the microcomputer chip 3 and cannot been seen, but in FIG. 8 they are illustrated in a see-through state through the microcomputer chip 3 in order to explain the distribution of the re-wiring lines 2f.

Figure 34:
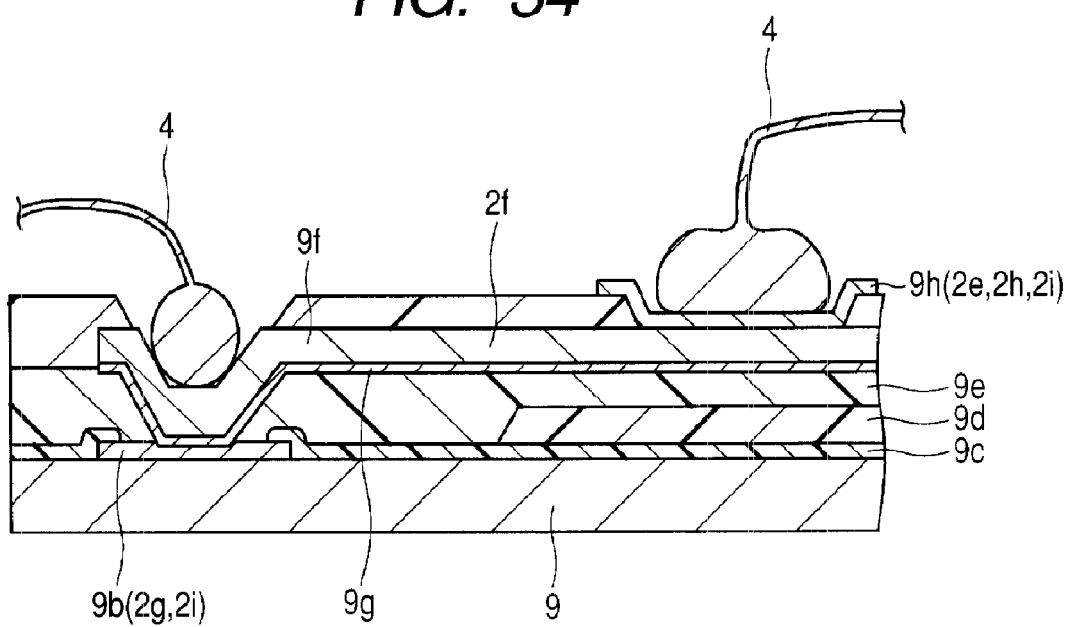
FIG. 34 is a partially enlarged sectional view of the structure taken along line A-A in FIG. 18.
Figure 35:
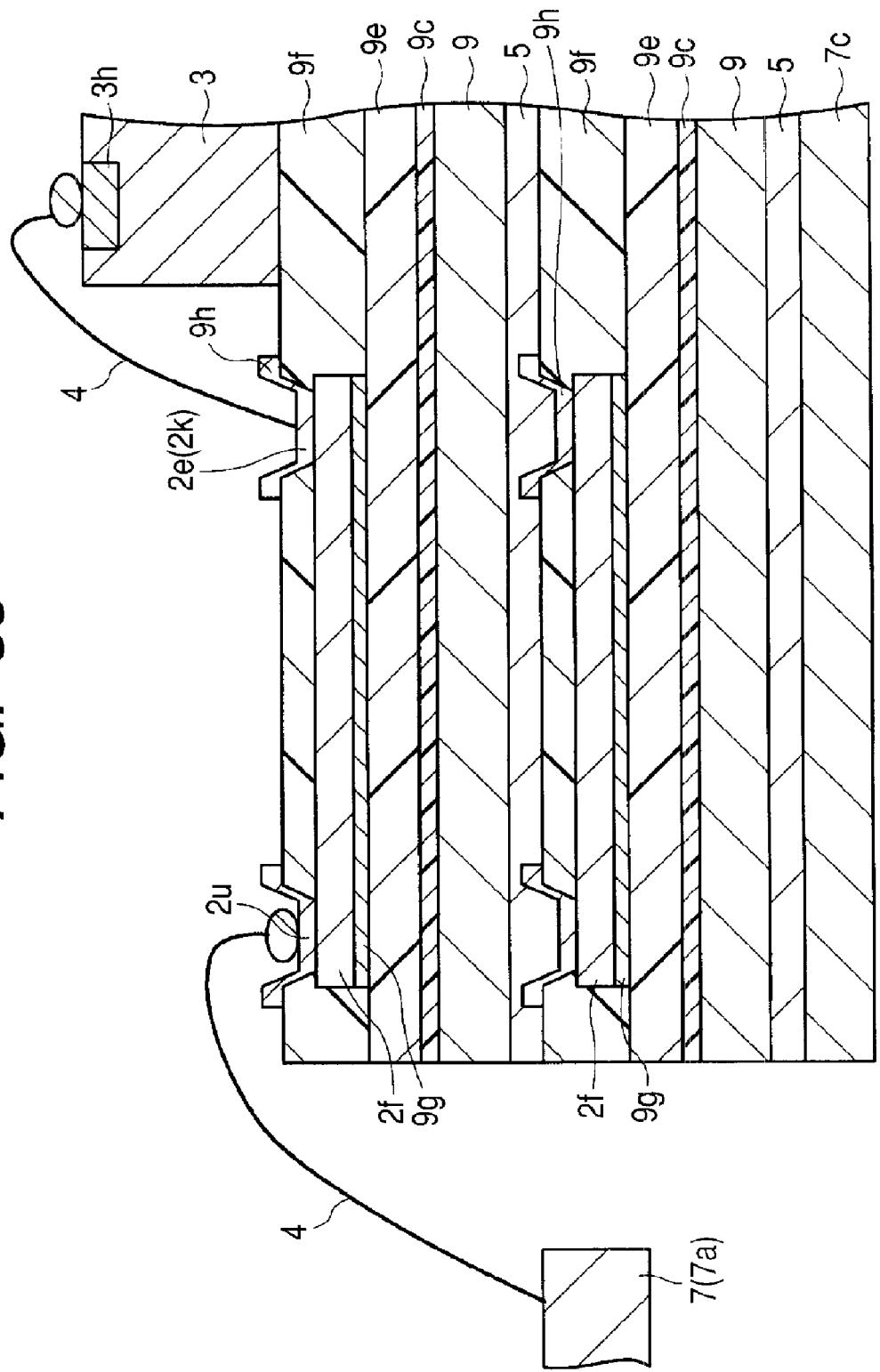
FIG. 35 is a partially enlarged sectional view of the structure taken along line B-B in FIG. 18.

Now, with reference to FIG. 5, a description will be given about the structure of a re-wiring section including the original pads 9b (2g, 2i), relocation pads 9h (2e) and re-wiring lines 2f. For example, though not shown, plural MOSFETs (Meal Oxide Semiconductor Field Effect Transistors) are formed on a surface of a silicon substrate 9 as a base board of the semiconductor chips (first and second memory chips 1, 2). Original pads 9b (2g, 2i) are bonding pads coupled electrically to those MOSFETs. A first protective film 9c and an overlying, second protective film 2d are formed around the original pads 9b. On the second protective film 9d are formed re-wiring lines (lead-out wiring lines) 2f, the re-wiring lines 2f being electrically coupled on one end side thereof to the original pads 9b and located on the opposite end side thereof at a position away from the original pads 9b. The re-wiring lines 2f are each formed on a barrier layer 9g of approximately the same shape and coupled on one end side thereof to the associated original pad 9b electrically through the barrier layer 9g. These are covered with a first insulating layer 9e and a second insulating layer 9f. On the opposite end side of each re-wiring line 2f a pad (relocation pad) 9h for coupling thereto of a wire 4 as an electrically conductive member is exposed from the second insulating film 9f and the wire 4 is coupled to the relocation pad 9h (2e). The relocation pad 9h (2e) is coupled electrically to a MOSFET through a re-wiring line 2f and an original pad 9b (2g, 2i). Such a configuration as shown in FIG. 5 is for wiring not coupled to an external device (external LSI) positioned in the exterior of the system but performing input and output of signals (data) in the interior of the system. On the other hand, in the case of wiring coupled to an external device (external LSI) positioned in the exterior of the system and performing input and output of signals (data), as shown in FIG. 34, a part of the second insulating film 9f is opened so that one end side of each re-wiring line 2f is also exposed. A portion of the re-wiring lines 2f exposed from the opening are formed as relocation pads, which relocation pads are coupled electrically through wires 4 to the inner leads (bonding leads) 7a as terminals of the substrate. Relocation pads 2e and 2j are coupled together electrically through re-wiring lines 2f, as shown in FIG. 35.

In this embodiment and in FIG. 8, of the pads (first pads 2c, second pads 2d) arranged in two rows along the lower side (or the upper side), the original pads 2g arranged in the first row close to the lower side (or the upper side) correspond to the original pads 9b shown in FIG. 5. Further, the pads 2e, 2h and 2j arranged in a position (row) closer to the microcomputer chip than the original pads 2i and 2g arranged in the first row correspond to the relocation pads 9h shown in FIG. 5.

The re-wiring lines 2f and the relocation pads 9h may be formed any time (in any process) if only the timing for formation is before the semiconductor wafer dicing process. For example, they may be formed in or after a pre-process for the semiconductor device manufacturing process. As to in which process the re-wiring lines 2f and relocation pads 9h have been formed, there is no special limitation.

Thus, plural first pads 2c comprising plural original pads 2g and plural relocation pads 2h are arranged along the lower side of the main surface 2a of the second memory chip 2 shown in FIG. 8. On the other hand, along the upper side opposed to the lower side of the chip main surface 2a there are arranged plural second pads 2d comprising plural original pads 2i and plural relocation pads 2j.

Further, plural pads (end pads for microcomputer chip) 2u are formed along both sides (short sides) free of the first and second pads 2c, 2d. The pads 2u are for coupling between the microcomputer chip 3 provided in the interior of the system and the external LSI positioned in the exterior of the system. The semiconductor device of this embodiment performs input and output of signals (data) between the interior and the exterior of the system through substrate terminals (bonding leads, inner leads 7a) formed around the semiconductor chip. However, if the wires 4 for electrical coupling between the terminals and the pads 2u are long, the signal transmission speed decreases. This is because the diameter of each wire 4 is smaller than the width of each re-wiring line 2f. In this embodiment, the re-wiring lines 2f are formed up to near the substrate terminals (memory chip ends) and the pads 2u are arranged along the sides (short and long sides) of the memory chip. In this case, it is preferable to arrange the pads in such a manner that the length of a wire (wire for external interface, wire for internal interface) 4 for electrical coupling between an electrode (electrode for external interface, electrode for internal interface) of the microcomputer chip and a corresponding pad (relocation pad 2e) is shorter than the length of the wiring line (re-wiring line 2f, lead-out wiring line) which provides coupling between the pad (relocation pad 2e) and the pad (original pad 2g, 2i) which corresponds to the pad. As shown in FIG. 35, the pads 2u arranged along the sides are also comprised of relocation pads configured by a portion of the re-wiring lines 2f. Further, around the central area of the main surface 2a for mounting the microcomputer chip 3 the relocation pads (third pads) 2e are formed along sides of the microcomputer chip 3. In this embodiment, plural relocation pads 2e are formed along three sides of the microcomputer chip 3. In short, the relocation pads 2e are arranged side by side in turned square U-shape.

The re-wiring lines 2f as lead-out wiring lines for relocation of pads not only provide coupling between the original pads 2g, 2i and the relocation pads 2e, 2j but also provide coupling between the relocation pads 2e and the end pads 2u for microcomputer chip which are relocation pads. The third pads 2e as relocation pads formed side by side in turned square U-shape around the area for mounting the microcomputer chip 3 are formed on the re-wiring lines 2f or coupled to ends of the re-wiring lines 2f. Many of the third pads 2e are coupled electrically to terminals 3c of the microcomputer chip 3 through wires 4.

Of the plural pads on the main surface 2a of the second memory chip 2 shown in FIG. 8, the square pads are the original pads and the rectangular pads are the relocation pas.

Also as to the microcomputer chip 3 mounted on the second memory chip 2, its main surface 3a is quadrangular and, as shown in FIG. 8, plural terminals 3c are arranged side by side in turned square U-shape along the outer periphery portions of three sides out of the four sides of the microcomputer chip 3.

Likewise, just the same wiring patterns and pads as those of the second memory chip 2 shown in FIG. 8 are formed on the first memory chip 1.

At the time of stacking the second memory chip 2 onto the first memory chip 1 during assembly of the SSOP 8 according to this embodiment, as shown in FIG. 3, the stacking is performed in such a manner that the positions of ends (long sides) are shifted from the positions of ends (long sides) of the first memory chip with respect to directions along suspending leads 7d, whereby plural first pads 1d of the first memory chip 1 as the lower-stage chip are exposed as in FIG. 7. That is, the second memory chip 2 is stacked on the first memory chip 1 in a state in which the center thereof is offset from the center of the first memory chip 1.

According to this structure, the second pads 2d of the second memory chip 2 as the second-stage (upper-stage) chip and second pads 1d of the first memory chip 1 as the first-stage (lower-stage) chip projected and exposed from an end of the second memory chip 2 as the second-stage chip can be coupled together electrically through wires 4.

As shown in FIG. 7, the re-wiring lines (lead-out wiring lines) 1f and 2f formed on the first memory chip 1 and the second memory chip 2 are also effective in making hidden pads of the lower-stage semiconductor chip to be exposed for wire bonding in the area projected from the upper-stage semiconductor chip when stacking a semiconductor chip (second memory chip 2) onto the other semiconductor chip (first memory chip 1).

That is, as in the SSOP 8 of this embodiment, when the first and second memory chips 1, 2 are stacked together, the first pads 1c of the underlying first memory chip 1 hidden under the second memory chip 2 as the upper-stage memory chip, whereby the first pads 1c (second pads 1d) of the underlying first memory chip 1 projected and exposed from the overlying second memory chip 2 and the second pads 2d of the overlying second memory chip 2 can be coupled together through wires. Further, by coupling the microcomputer chip 3 and the third pads 2e formed on the re-wiring lines 2f with each other through wires 4 over the top memory chip (second memory chip 2), it is possible to implement wire coupling of plural stacked memory chips without intervention of such a spacer 24 as shown in the comparative example of FIG. 33.

Figure 30:
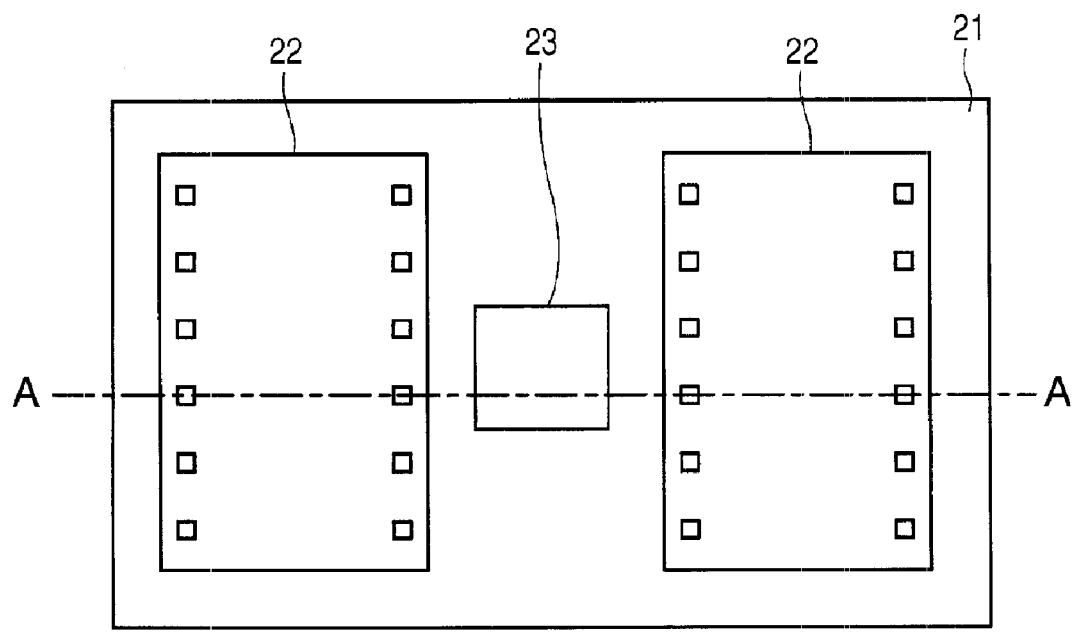
FIG. 30 is a plan view showing an internal structure with a sealing body removed of a semiconductor device according a first comparative example.

Thus, in the SSOP 8 of this embodiment, as compared with the semiconductor device of such a structure as shown in the comparative example of FIG. 30 wherein plural memory chips 22 and a microcomputer chip 23 are placed flatways, the area in the planar direction can be reduced and hence it is possible to attain the reduction in size of the semiconductor device (SSOP 8) having stacked thereon plural memory chips (first and second memory chips 1, 2) and one microcomputer chip 3.

Figure 31:
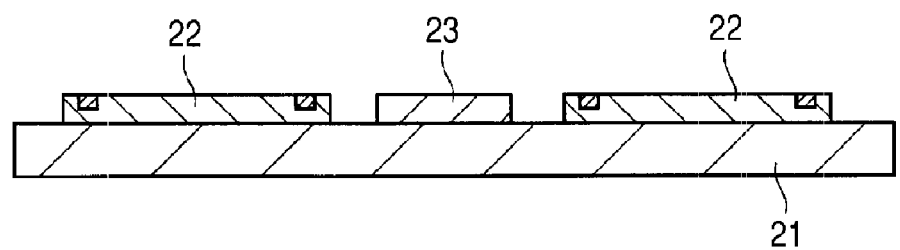
FIG. 31 is a sectional view taken along line A-A in FIG. 30, showing a structural example.
Figure 32:
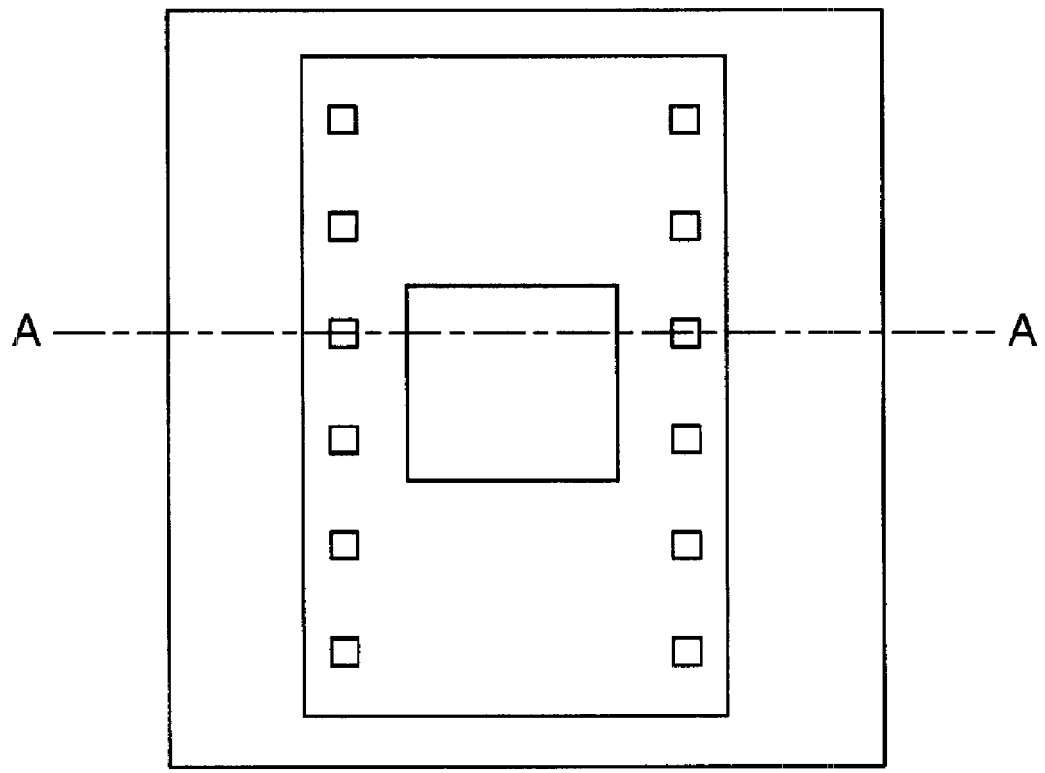
FIG. 32 is a plan view showing an internal structure with a sealing body removed of a semiconductor device according to a second comparative example.

Besides, as shown in the comparative example of FIG. 31, since wire bonding of plural stacked memory chips (first and second memory chips 1, 2) can be done without intervention of the spacer 24, it is possible to attain the reduction in thickness as compared with the semiconductor device of the type using the spacer 24.

Moreover, in such a semiconductor device of SIP structure as the SSOP 8, the microcomputer chip 3 and the memory chips (first and second memory chips 1, 2) can be mounted efficiently.

Further, since the microcomputer chip 3 is mounted at a center on the main surface 2a of the overlying second memory chip 2, the wiring lines for coupling between the microcomputer chip 3 with plural terminals 3c formed in turned square U-shape along three sides of the main surface 3a and the exterior can be distributed in a well-balanced manner on the main surface 2a of the second memory chip 2.

More specifically, the terminals 3c of the microcomputer chip 3 are arranged in turned square U-shape along three sides of the main surface 3a, as shown in FIG. 8. In this case, it is necessary that the wiring be distribution while taking into account on the second memory chip 2 not only the coupling of the microcomputer chip 3 with the memory chip but also the exchange of signals for an external device positioned in the exterior of the system. In view of this point, electrodes (electrodes for external interface, external coupling terminals) 3h for exchange of signals with the external device are formed along a pair of mutually opposed first sides 3e of the main surface 3a of the microcomputer chip 3 out of the terminals 3c arranged in turned square U-shape on the microcomputer chip 3, while electrodes (electrodes for internal interface, terminals for memory chip) 3g for exchange of signals with the memory chip are formed along a second side 3f. In more particular terms, the electrodes of the microcomputer chip 3 include plural pads (electrodes for internal interface, terminals for memory chip) 3g for input and output of data for the interior of the system which is comprised of the memory chips and the microcomputer chip, the electrodes for internal interface being arranged along a second side 3f positioned side by side with the upper side (long side) of the memory chip. Further, the electrodes of the microcomputer chip 3 include plural pads (electrodes for external interface, terminals for external coupling) 3h for input and output of data for the exterior of the system, the electrodes for external interface being arranged along the first sides (the sides positioned side by side with the short sides of the memory chip) 3e intersecting the second side 3f along which the electrodes 3g for external interface are arranged. In the second memory chip 2, correspondingly to the above layout of terminals of the microcomputer chip 3, plural pads 2k for microcomputer chip are formed along and near the outside of the opposed first sides 3*e* of the microcomputer chip 3, the pads 2*k* being positioned on the route of electrical coupling between the microcomputer chip 3 and the external device positioned in the exterior of the system, the pads 2*k* being coupled to plural pads 3*h* of the microcomputer chip 3 through plural wires 4. Thus, the pads 2*k* for microcomputer chip are arranged along the sides different from the sides where the first pads 2*c* and second pads 2*d* on the main surface 2*a* of the second memory chip 2 are arranged.

The pads 2*k* for microcomputer chip formed along and near the outside of the first sides 3*e* of the microcomputer chip 3 are drawn out up to near end portions of the second memory chip 2 and plural pads 2*u* for microcomputer chip coupled to the re-wiring lines 2*f* are formed at the end portions of the second memory chip 2. In this embodiment, the pads (end pads for microcomputer chip) 2*u* coupled to terminals (bonding leads, inner leads 7*a*) of the substrate through wires 4 are not only arranged along the short sides of the second memory chip but also arranged along the long sides (upper and lower sides) of the second memory chip. More particularly, some of the end pads 2*u* for microcomputer chip are arranged along the long sides (upper and lower sides) of the memory chip in order to decrease the number of wires 4 for coupling with the substrate terminals positioned on the long sides of the memory chip. This configuration will now be explained in terms of a sectional view. As shown in FIG. 35, without electrical coupling with any MOSFET (not shown) formed on the main surface of the memory chip, the pads 2*k* for microcomputer chip formed in the vicinity of the microcomputer chip 3 and the pads 2*u* for microcomputer chip formed at end portions of the memory chip are coupled together electrically through only re-wiring lines 2*f* (or re-wiring lines 2*r* for clock) formed on the first insulating film 9*e*.

Consequently, the wires 4 coupled to substrate terminals (bonding leads, inner leads 7*a*) can be coupled to the end pads 2*u* for microcomputer chip drawn out to the end portions by the re-wiring lines 2*f* without being directly coupled to the pads 2*k* for microcomputer chip located near the microcomputer chip 4. As a result, input and output of signals (data) between the interior and the exterior of the system can be processed at high speed. Besides, since the wires 4 can be made short, it is possible to prevent wire shorting which occurs due to flowing of the wires 4 under the action of a resin injection pressure in a later process of forming the sealing body 6.

In this way the external coupling terminals 3*h* of the microcomputer chip 3 exchange signals for the external device through the pads 2*k* for microcomputer chip formed on the second memory chip 2 and end pads 2*u* for microcomputer chip.

Thus, the microcomputer chip 3 is arranged at a center of the second memory chip 2, taking into account the balance in up, down and right, left directions of wiring distribution over the second memory chip 2. As to coupling with memory chip, the pads 2*k* for microcomputer chip formed on the memory chip for coupling with the external coupling terminals 3*h* of the microcomputer chip 3 through wires 4 are positioned over the re-wiring lines 2*f* centrally of the second memory chip 2 and in this state there is made coupling of the microcomputer chip 3 with the pads 2*k* for microcomputer chip.

As a result, it is possible to improve the balance in up, down and right, left directions of wiring distribution over the second memory chip 2 coupled to the microcomputer chip 3.

In the SSOP 8, the same wiring patterns are formed on each of stacked, plural memory chips (first and second memory chips 1, 2). That is, in the SSOP 8, the same wiring patterns and pads are formed on the main surfaces 1*a* and 2*a* of the first and second memory chips 1, 2.

Consequently, it is possible to reduce the memory chip manufacturing cost. That is, when yield and the type of mask are taken into account in the manufacture of memory chips, the use of one type of a mask pattern results in reduction of the manufacturing cost. In this case, unnecessary wiring patterns are formed for a certain semiconductor chip, but standardizing the memory chip wiring pattern permits reduction of the memory chip manufacturing cost. Further, the memory chip wiring design can be facilitated.

As shown in FIG. 8, among various re-wiring lines (lead-out wiring lines) 2*f*, re-wiring lines for power supply (lead-out wiring lines for power supply, including re-wiring lines for GND) 2*n* are formed thicker than re-wiring lines for signal (lead-out wiring lines for signal) 2*p*. More specifically, the wiring lines (re-wiring lines for power supply, lead-out wiring lines for power supply) 2*n* coupled to the relocation pads 2*h* which are provided for the supply of electric power (or GND) from the exterior of the system are formed thicker than the wiring lines (re-wiring lines for signal, lead-out wiring lines for signal) 2*p* coupled to the relocation pads 2*u* which are provided for input and output of signals (data) for the exterior of the system.

As a result, it is possible to strengthen the power supply and GND.

As shown in FIG. 8, pads 2*q* for clock which are for the supply of clock signals to the microcomputer chip 3 are formed on the main surface 2*a* of the second memory chip 2, and the pads 2*q* for clock and re-wiring lines for clock (lead-out wiring lines for clock) 2*r* coupled to the pads 2*q* are shielded by thick GND lines 2*v*. More specifically, on the main surface of the memory chip there are formed pads for clock (first clock pads) 2*q* arranged near the microcomputer chip 3 (closer to the microcomputer chip 3 than second clock pads 2*q*) for the supply to clock signals to the microcomputer chip, wiring lines (lead-out wiring lines for clock) 2*r* coupled at one ends to the first clock pads 2*q*, and plural pads including pads for clock (second clock pads) 2*q* coupled to opposite ends opposite to the one ends of the lead-out wiring lines 2*r* for clock, the second clock pads 2*q* being arranged at ends (at positions closer to memory chip ends than the first clock pads). The plural pads formed on the main surface of the memory chip further include first GND pads adjacent to the first clock pads and second GND pads adjacent to the second clock pads. Lead-out wiring lines for GND are formed so as to couple the first and second GND pads with each other and so as to surround all of the first and second clock pads and the lead-out wiring lines for clock. That is, clock signals inputted from the clock pads 2*q* are the highest in transmission speed among all the signals inputted from the external terminals (or the frequency of a handling signal is higher than that of other signals).

Therefore, noise is apt to occur from the clock pads 2*q* and the re-wiring lines 2*r* for clock coupled thereto. The generation of noise can be reduced by surrounding the clock pads 2*q* and the re-wiring lines 2*r* for clock with GND lines 2*v* which are thicker than the re-wiring lines 2*f* for input and output of signals (data).

Figure 9:
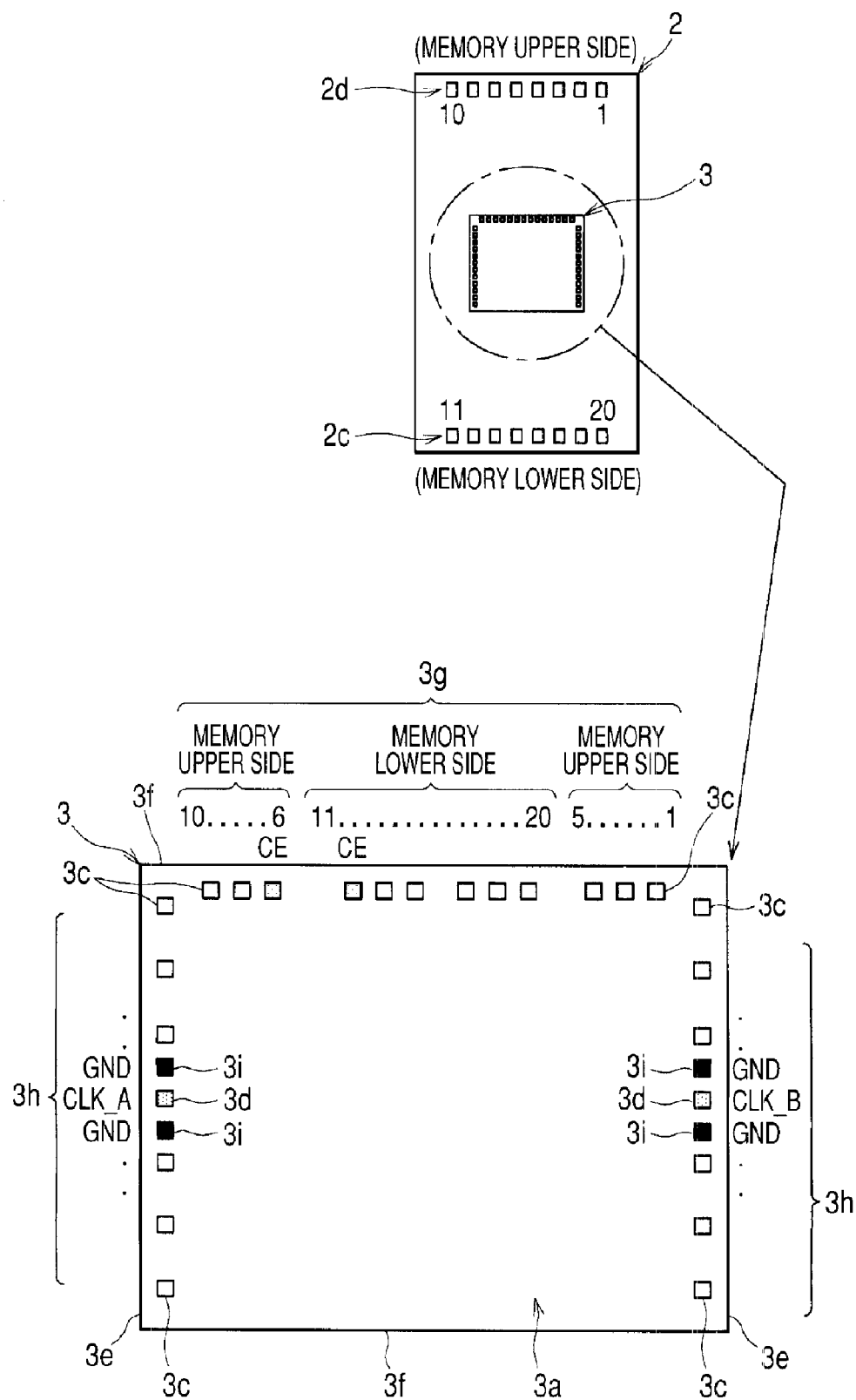
FIG. 9 comprises a plan view and an enlarged plan view, showing an example of a positional relation in pad array between a microcomputer chip and a memory chip both mounted on the semiconductor device of FIG. 1.

In this embodiment, the terminals 3*d* for clock of the microcomputer chip 3 coupled electrically to the clock pads 2*q* formed on the main surface of the second memory chip 2 are each arranged at a center of one side (first side 3*e*) with respect to plural electrodes (electrodes for external interface) 3*c* formed on the main surface 3*a* of the microcomputer chip 3, as shown in FIG. 9. GND terminals 3*i* are arranged on both sides of the clock terminal 3*d*.

In order to introduce clock signals supplied from the exterior of the system in the shortest route into the microcomputer chip 3, the clock pads 2q formed on the main surface of the memory chip 2 are also arranged at a center of the short sides of the memory chip. As a result, the re-wiring lines 2r for clock formed on the main surface of the memory chip 2 can be formed at the shortest distance. That is, the distance (including wires 4 and substrate terminals) between the exterior of the system for transmission of clock signals and the microcomputer chip 3 can be made shortest.

Consequently, clock signals to be transmitted at high speed can be transmitted without decreasing the transmission speed.

In the re-wiring lines for power supply (lead-out wiring lines for power supply) 2n formed on the main surface 2a of the second memory chip 2, as shown in FIG. 8, power supply wiring lines 2s for microcomputer chip and power supply wiring lines 2t for memory chip are formed separately. That is, electric power is supplied separately with use of a power supply for microcomputer chip and a power supply for memory chip, whereby only one can be operated selectively. This is very effective for individual analysis.

Next, with reference to FIGS. 6 and 7, a description will be given about the flow of electric signals in upper and lower memory chips provided with the same patterns. FIG. 6 shows the case of chip intrinsic signals and FIG. 7 shows the case of chip common signals. As shown in FIG. 6, in the case of chip intrinsic signals, an intrinsic signal pad 1i (original pad 1g) of the underlying first memory chip 1 and an intrinsic signal pad 2m (original pad 2g) of the overlying second memory chip 2 are arranged at the same position planarly. The intrinsic signal pad 1i of the underlying first memory chip 1 is drawn out by a re-wiring line 1f and is coupled to a relocation pad 1h arranged at an opposite-side end. Likewise, the intrinsic signal pad 2m of the overlying second memory chip 2 is also drawn out by a re-wiring line 2f and is coupled to a relocation pad 2h arranged at an opposite-side end. Provided, however, that the relocation pad 1h of the underlying first memory chip 1 is coupled electrically through a wire 4 to a relocation pad located at a position shifted by one position. That is, the relocation pad 1h arranged at an end of the underlying first memory chip 1 is coupled electrically through a wire 4 not to the relocation pad 2h arranged at the same end position of the overlying second memory chip but to the relocation pad 2h arranged at a position shifted by one position.

In this case, chip intrinsic signals flow in the following manner. A chip control signal A (arrow A) provided from a terminal 3c of the microcomputer chip 3 is transmitted to the intrinsic signal pad 2m on the second memory chip 2 via a relocation pad 2h (third pad 2e) formed on a re-wiring line 2f of the second memory chip 2. On the other hand, a chip control signal B (arrow B) provided from a terminal 3c of the microcomputer chip 3 is transmitted to a relocation pad 2h arranged at an end via a relocation pad 2h (third pad 2e) formed on a re-wiring line 2f of the second memory chip 2, then is transmitted through a wire 4 to a relocation pad 1h at an end of the underlying first memory chip 1 located at a position shifted by one position and is thereafter transmitted to the intrinsic signal pad 1i on the first memory chip 1.

Thus, even if the overlying and underlying memory chips are of the same wiring patterns, the intrinsic signals of the memory chips provided from separate terminals 3c of the microcomputer chip 3 can reach the intrinsic signal pads 1i and 2m which are formed planarly at the same positions between lower and upper stages.

In the case of the chip common signals shown in FIG. 7, a first pad control signal C (arrow C) provided from a terminal 3c of the microcomputer chip 3 reaches a relocation pad 2h (third pad 2e) formed on a re-wiring line 2f of the second memory chip 2, then branches into two, one of which is transmitted to a first pad 2c (original pad 2g) through the re-wiring line 2f on the second memory chip 2, while the other reaches a second pad 2d (relocation pad 2h) on the opposite side through the re-wiring line 2f, then reaches a second pad 1d (relocation pad 1h) of the underlying first memory chip 1 through a wire 4 and is thereafter transmitted to a first pad 1c (original pad 1g) of the first memory chip 1 through a re-wiring line 1f. In this way the first pad control signal C as a common signal provided from a terminal 3c of the microcomputer chip 3 is transmitted to the first pad 2c (original pad 2g) of the overlying second memory chip and also to the first pad 1c (original pad 1g) of the underlying first memory chip 1 located at the same position as that of the first pad 2c.

A second control signal D (arrow D) provided from a terminal 3c of the microcomputer chip 3 reaches a relocation pad 2h (third pad 2e) formed on a re-wiring line 2f of the second memory chip 2 and thereafter reaches a second pad 2d (original pad 2g) through the re-wiring line 2f, then is transmitted to a second pad 1d of the underlying first memory chip 1, the second pad 1d being coupled to the second pad 2d through a wire 4 and located at the same position as the second pad 2d. In this way the second pad control signal D as a common signal provided from a terminal 3c of the microcomputer chip 3 is transmitted to the second pad 2d (original pad 2g) of the overlying second memory chip 2 and also to the second pad 1d (original pad 1g) of the underlying first memory chip 1, the second pad 1d being located at the same position as the second pad 2d.

Thus, the chip common signals provided from terminals 3c of the microcomputer chip 3 can reach the associated pads formed at the same positions planarly between the upper and lower memory chips even if both chips are of the same wiring patterns.

Next, with reference to FIG. 9, a description will be given about a positional relation between the array of pads on the microcomputer chip and that on memory chips, i.e., a relation between the array of terminals on the microcomputer chip 3 and pads on memory chips. Of the terminals 3g for memory chip arranged in one row on a second side 3f (upper side) of the microcomputer chip 3, the terminals 3c coupled electrically to the lower first memory chip 1 on the memory upper side are mainly arranged (e.g., No. 1 to No. 5 pins, No. 6 to No. 10 pins) at end portions of the second side 3f and the terminals 3c drawn out over a memory chip to the memory lower side and coupled electrically to the upper second memory chip 2 at the memory lower side are arranged (e.g., NO. 11 to No. 20 pins) at a center of the second side 3f. It goes without saying that no limitation is made to the above pin numbers of the microcomputer chip 3 and distribution of terminals to the memory upper and lower sides.

Thus, also in the plural terminals 3g for memory chip arranged in one row on the microcomputer chip 3, wiring lines to the upper and lower memory chips are distributed to end and central portions so as not to offset to any one side.

In the microcomputer chip 3, the external coupling terminals 3h formed along the first sides 3e as both sides of the microcomputer chip 3 are provided so as to be coupled in one-to-one relation to the inner leads 7a via pads 2k for microcomputer chip, end pads 2u for microcomputer chip and the first pads 2c or the second pads 2d which are all formed on the second memory chip 2.

A circuit configuration of the SSOP 8 will now be described with reference to FIG. 10. As shown in the same figure, the first memory chip 1 and the second memory chip 2 operate in accordance with control signals provided from the microcomputer chip 3. Therefore, the first and second memory chips 1, 2 are not coupled directly to external terminals except to power supply (Vcc) and GND (Vss) terminals.

Controls signals such as I/O provided from the microcomputer chip 3 are common to both first and second memory chips 1, 2, but as to chip select signals (CE0, CE1), separate signals are transmitted in the first and second memory chips 1, 2.

Now, with reference to FIGS. 11 and 12, a description will be given about the coupling of chip select pins in the microcomputer chip 3 and memory chips. FIG. 11 shows the coupling of chip select pins between the microcomputer chip 3 and same pattern memory chips in a stacked configuration wherein the microcomputer chip 3 is stacked over same pattern memory chips which are stacked in four stages. The array of chip select pins is interchanged between the microcomputer chip 3 and the same pattern memory chips 13.

More specifically, as shown in FIG. 11, pin numbers on the microcomputer chip 3 are usually, for example, in the order of [0], [1], [2], [3], but in the SSOP 8 of this embodiment it is changed to [2], [0], [1], [3].

Thus, by interchanging the positions of chip select pins in the terminals 3c on the microcomputer chip 3 it is possible to prevent crossing of wiring lines such as wires 4.

Moreover, as shown in FIG. 12, by using wide pads 13b as pads 13a on the same pattern memory chips 13 it is possible to avoid wire shorting.

Next, with reference to FIGS. 13 to 23, a description will be given below about assembling the SSOP 8 of this embodiment.

First, a lead frame 7 shown in FIG. 13 is provided. The lead frame 7 includes a tab 7c which permits mounting of semiconductor chips thereon, suspending leads 7d for supporting the tab 7c, plural inner leads 7a arranged around the tab 7c, and plural outer leads 7b coupled to the inner leads 7a.

Thereafter, there is performed First Memory Chip Bonding of step S1 shown in FIGS. 20 and 22. In this step, the main surface 1a of the first memory chip 1 is turned upward and the first memory chip 1 is mounted on the tab 7c in such a manner that the row of first pads 1c and that of second pads 1d of the first memory chip 1 intersect the extending direction of the suspending leads 7d shown in FIG. 14. At this time, the first memory chip 1 is mounted through, for example, such a pasty adhesive 5 as shown in FIG. 4.

Subsequently, there is performed Second Memory Chip Bonding of step S2 shown in FIGS. 20 and 22. In this step, the second memory chip 2 is mounted on the main surface 1a of the first memory chip 1 in such a manner that the main surface 2a thereof faces upward. At this time, the second memory chip 2 is mounted on the first memory chip 1 in such a manner that the row of first pads 2c and that of second pads 2d intersect the extending direction of the suspending leads 7d. The second memory chip 2 is mounted through, for example, a filmy adhesive 5.

As shown in FIGS. 3 and 15, the second memory chip 2 is stacked on the first memory chip 1 in such a manner that end positions of the second memory chip 2 are shifted from end positions of the first memory chip 1, thereby allowing plural second pads 1d of the underlying first memory chip 1 to be exposed.

Subsequently, there is performed Microcomputer Chip Bonding of step S3 shown in FIGS. 20 and 22. In this step, the microcomputer chip 3 is mounted on the main surface 2a of the second memory chip 2 in a state in which its main surface 3a faces upward. At this time, like the second memory chip 2, the microcomputer chip 3 is also mounted through a filmy adhesive 5 for example. Further, as shown in FIG. 16, the microcomputer chip 3 is mounted at a center of the second memory chip 2. The mounting is done in such a manner that the direction of arrangement of the external coupling terminals 3h on the main surface 3a of the microcomputer chip 3 coincides with the extending direction of the suspending leads 7d and that the row of memory chip terminals 3g on the microcomputer chip 3 is positioned on the second pads 2d side of the second memory chip 2.

Thereafter, there is performed Wire Bonding of step S4 shown in FIGS. 21 and 23. In this step, as shown in FIG. 8, the external coupling terminals 3h of the microcomputer chip 3 and the third pads 2e of the second memory chip 2 are coupled together electrically through wires 4 and the terminals 3g for memory chip of the microcomputer chip 3 and the third pads 2e of the second memory chip 2 are coupled together electrically through wires 4. Moreover, as shown in FIGS. 8, 17 and 18, the first and second pads 2c, 2d and end pads 2u for microcomputer chip on the second memory chip 2, as well as the inner leads 7a corresponding thereto respectively, are coupled together electrically through wires 4.

Further, the second pads 2d of the overlying second memory chip 2 and the second pads 1d of the underlying first memory chip 1 projected and exposed from an end of the second memory chip 2 are coupled together electrically through wires 4.

Then, there is performed Transfer Molding of step S5 shown in FIGS. 21 and 23. In this step, a sealing body 6 shown in FIG. 19 is formed using sealing resin. The first memory chip 1, second memory chip 2, microcomputer chip 3, tab 7c, plural wires 4 and plural inner leads 7a are resin-sealed with the sealing body 6.

Subsequently, there is performed Cutting/Forming of step S6 shown in FIG. 21. In this step, the lead frame 7 is cut at front ends of the outer leads 7b and the outer leads 7b are bent in a gull wing shape.

The assembling work for the SSOP 8 is now completed.

Next, a description will be given below about a semiconductor device (memory card) according to a modification of this embodiment, which is shown in FIGS. 24 to 27.

The semiconductor device shown in FIGS. 24 to 26 is a memory card 12 formed by stacking memory chips on a wiring substrate 10, mounting a microcomputer chip 3 on the top memory chip and covering them with a thin case 11.

The configuration of the memory card 12 will now be described. The memory card 12 comprises a wiring substrate 10, the wiring substrate 10 having a main surface 10a with a first memory chip 1, a second memory chip 2 and a microcomputer chip 3 stacked thereon and a back surface 10b with plural external leads (external terminals) 10c formed thereon, as shown in FIG. 27, plural wires 4 for electrical coupling between pads on the second memory chip 2 located at the top stage and bonding leads 10d of the wiring substrate 10, and a thin case 11.

That is, on the main surface 10a of the wiring substrate 10, the first memory chip 1, second memory chip 2, microcomputer chip 3 and plural wires 4 are covered with the case 11 which accommodate them. The case 11 is formed in the shape of a thin card and, in combination with the wiring substrate 10, forms the memory card 12.

As shown in FIG. 27, the first memory chip 1 is mounted on the main surface 10a of the wiring substrate 10 through an adhesive 5 and pads formed on its main surface 1a and the bonding leads 10d formed on the main surface 10a of the wiring substrate 10 are coupled together electrically through wires 4. The bonding leads 10d are drawn out to the back surface 10b through Cu wiring lines 10f and via wiring lines 10e, and on the back surface 10b side the via wiring lines 10e are coupled to the external leads 10c as external terminals through Cu wiring lines 10f. In the wiring substrate 10, Cu wiring lines 10f are formed on each surface of a core member 10g and a solder resist 10h is formed thereon. Bonding leads 10d coupled to the Cu wiring lines 10f and external leads 10c are formed in an exposed state in apertures of the solder resist 10h. In FIG. 27, it is, for example, power supply lines and GND lines that are coupled to the external leads 10c directly from the first memory chip 1.

The memory chips stacked on the wiring substrate 10 are the first memory chip 1 and the second memory chip 2 and concrete wiring patterns such as re-wiring lines and relocation pads are not illustrated in the drawing. However, these memory chips are the same as the first and second memory chips installed in the SSOP 8 of the above embodiment. That is, the first and second memory chips 1, 2 incorporated in the memory card 12 also have the same wiring patterns.

The microcomputer chip 3 is also the same as the microcomputer chip 3 mounted on the SSOP 8.

Thus, also in the memory card 12 of this modification, as is the case with the SSOP 8, in connection with the first memory chip 1 and the second memory chip 2 stacked one on the other, by drawing pads on the underlying first memory chip 1 hidden by the overlying second memory chip 2 with use of re-wiring lines, the pads on the underlying first memory chip 1 projected and exposed from the overlying second memory chip 2 and the pads on the overlying second memory chip 2 can be coupled together through wires.

Figure 33:
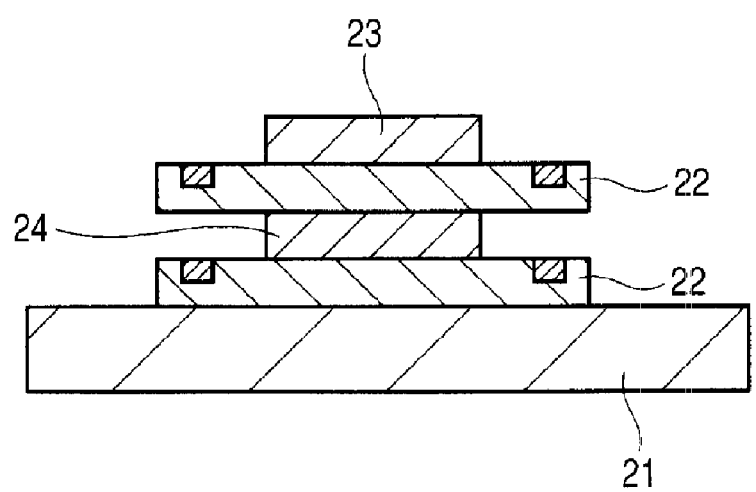
FIG. 33 is a sectional view taken along line A-A in FIG. 32, showing a structural example.

Further, on the second memory chip as the top-stage memory chip, by coupling the microcomputer chip 3 and third pads formed on re-wiring lines with each other through wires 4, it is possible to effect coupling of the stacked, plural memory chips through wires without intervention of such a spacer 24 as shown in the comparative example of FIG. 33. As to other effects obtained by the memory card 12 of this modification, they are the same as those of the SSOP 8 and therefore a tautological explanation thereof is here omitted.

Next, a description will be given below about a modification shown in FIGS. 28 and 29.

FIGS. 28 and 29 each show a modified example of a terminal array on the main surface 3a of the microcomputer chip 3. According to the modified example shown in FIG. 28, in the terminal array on the main surface 3a of the microcomputer chip 3 shown in FIG. 9, plural terminals 3g for memory chip formed in one row on the memory upper side (second side 3f) are distributed also to the memory lower side (second side 3f) opposed to the memory upper side and are thus dispersed to both memory upper and lower sides.

Thus, in the microcomputer chip 3, the terminals 3g for memory chip are formed along two second sides 3f (memory upper side and memory lower side) confronting each other. Further, the terminals 3g for memory chip arranged dispersively on the two second sides 3f are coupled electrically through wires 4 to the third pads 2e on the re-wiring lines (lead-out wiring lines) 2f shown in FIG. 8.

As shown in FIG. 28, by dispersing the plural terminals 3g for memory chip to both upper and lower sides over the microcomputer chip 3, it is possible to widen the pad pitch between adjacent terminals 3g for memory chip and hence possible to facilitate pattern design for the microcomputer chip 3 and memory chips.

According to the modified example shown in FIG. 29, for example, in the memory card 12, when plural cutout portions are formed on one side of the wiring substrate 10 and a large number of wires 4 cannot be laid on the one side at the time of wire coupling between a memory chip and the wiring substrate 10, the external coupling terminals 3h of the microcomputer chip 3 are gathered on the side (a first side 3e located at the right of FIG. 29) opposite to the one side and are arranged in one row along the first side 3e.

That is, in the microcomputer chip 3, the plural external coupling terminals 3h may be formed along only one of two opposed sides (first sides 3e).

Thus, even when plural cutout portions are formed on one side of the wiring substrate 10 of the memory card 12, the external coupling terminals 3h of the microcomputer chip 3 are gathered and arranged on the side opposite to the side where the cutout portions are formed, whereby the external coupling terminals 3h gathered to one side can be coupled through wires 4 to the pads 2k for microcomputer chip formed on the memory chip 2.

According to a further modified example of FIG. 29, for example, the external coupling terminals 3h and the terminals 3g for memory chip may be formed along any one side of the microcomputer chip 3, or the terminals 3g for memory chip coupled to the underlying memory chip and the terminals 3g for memory chip coupled to the overlying memory chip may be arranged side by side with one side.

Although the present invention has been described above concretely by way of an embodiment thereof, it goes without saying that the present invention is not limited to the above embodiment, but that various changes may be made within the scope not departing from the gist of the invention.

For example, although in the above embodiment reference has been made as an example to the case where two memory chips (the first memory chip 1 and the second memory chip 2) are stacked in layers, the number of stacked layers of memory chips is not specially limited insofar as it is two or more.

Figure 36:
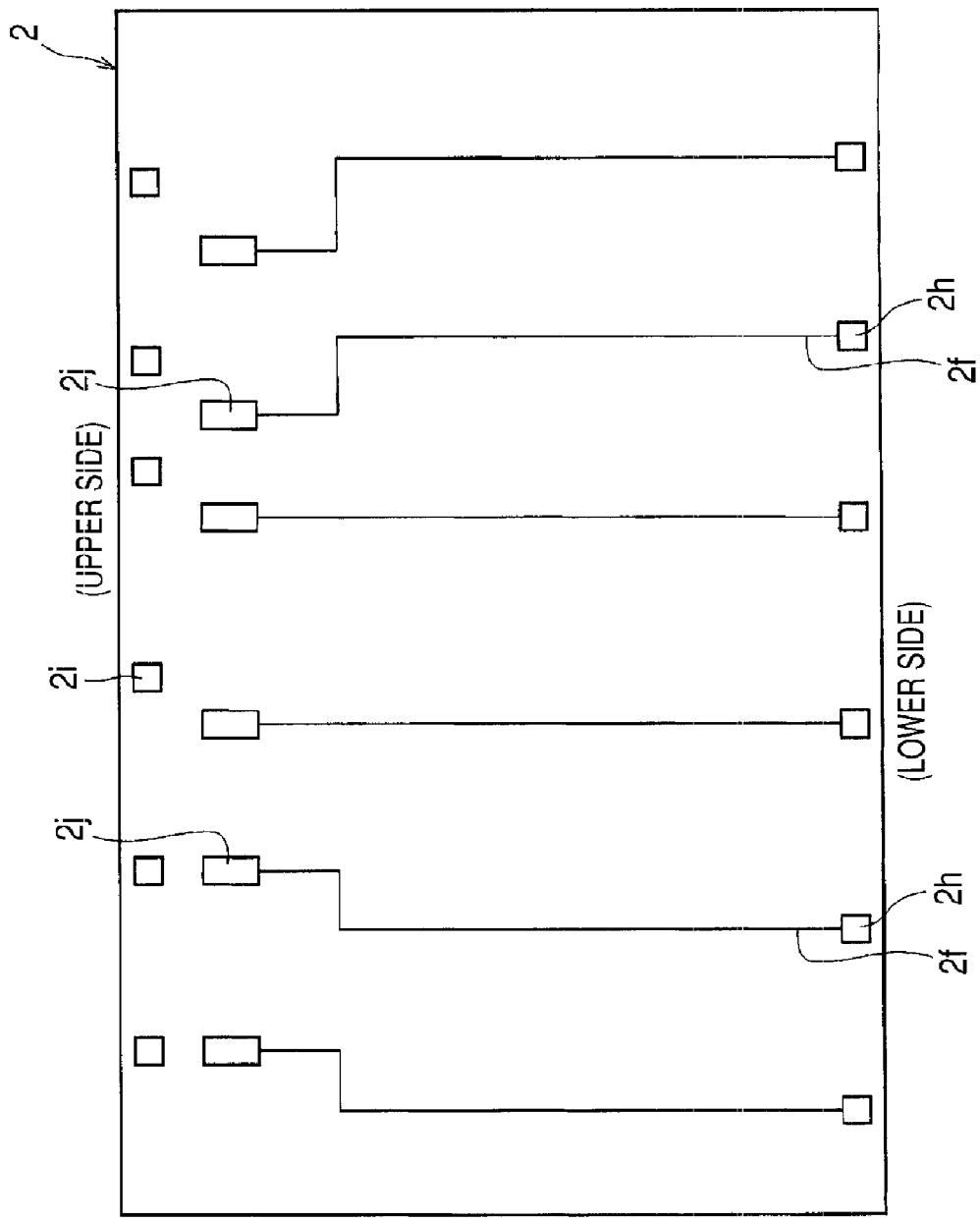
FIG. 36 is a plan view showing a modified example of layout of re-wiring lines formed on a main surface of a lower-stage memory chip.

According to the above embodiment, in the stacked memory chips, the wiring pattern of the first memory chip 1 (layout of re-wiring lines 2f) and that of the second memory chip 2 (layout of re-wiring lines 2f) are completely the same. However, both memory chips 1 and 2 may be different in the wiring pattern (layout of re-wiring lines 2f). In the above embodiment, as shown in FIG. 8, the microcomputer chip 3, whose outline size is smaller than that of the memory chips, is mounted almost at a center of the memory chip 2 positioned at the top stage out of the stacked, plural memory chips 1 and 2. Therefore, when the original pads of the memory chip 2 and the pads 3c of the microcomputer chip 3 are coupled together electrically through wires 4, the length of each coupled wire 4 becomes longer. This may result in decrease of the single speed in the case of a clock signal which handles a high-speed signal. In view of this point, according to the above embodiment, re-wiring lines are formed up to near the microcomputer chip 3, relocation pads are arranged near the microcomputer chip 3 (at a position closer to the microcomputer chip 3 than the original pads), and wires 4 are coupled to those relocation pads. Since the width of each re-wiring line is larger than the wire diameter, it is possible to suppress a decrease of the signal speed as compared with the configuration wherein the original pads of the memory chip 2 and the pads 3c of the microcomputer chip 3 are coupled together electrically through wires 4. However, the microcomputer chip 3 is not mounted on the main surface of the underlying memory chip (memory chip or chips other than the top-stage memory chip). Accordingly, if re-wiring lines and relocation pads are formed on the main surface of the underlying memory chip in conformity with the top-stage memory chip, inputted or outputted signals (data) travel through the relocation pads 2e which are arranged at a center of the main surface of the second memory chip for electric coupling with the microcomputer chip 3 through wires 4, from plural pads 2g covered with the overlying memory chip 2 and arranged along the lower side of the underlying memory chip 1, up to relocation pads 2*j* exposed from the overlying memory chip 2 and arranged along the upper side of the underlying memory chip 1. As a result, the pads drawn out from the lower to the upper side in the underlying chip 1 become larger in wiring length and lower in signal speed. In this case, by changing the wiring pattern (layout of re-wiring lines 2*f*) between the first memory chip 1 and the second memory chip 2, it is possible to make the route of each wiring line which handles a high-speed signal as short as possible lest the chip function should be deteriorated. As to the wiring pattern of the first memory chip 1, for example as shown in FIG. 36, re-wiring lines 2*f* are formed so as to be approximately rectilinear (a shape running along short sides) from original pads 2*h* arranged along the lower side (long side) up to relocation pads 2*j* arranged along the upper side (long side).

Figure 37:
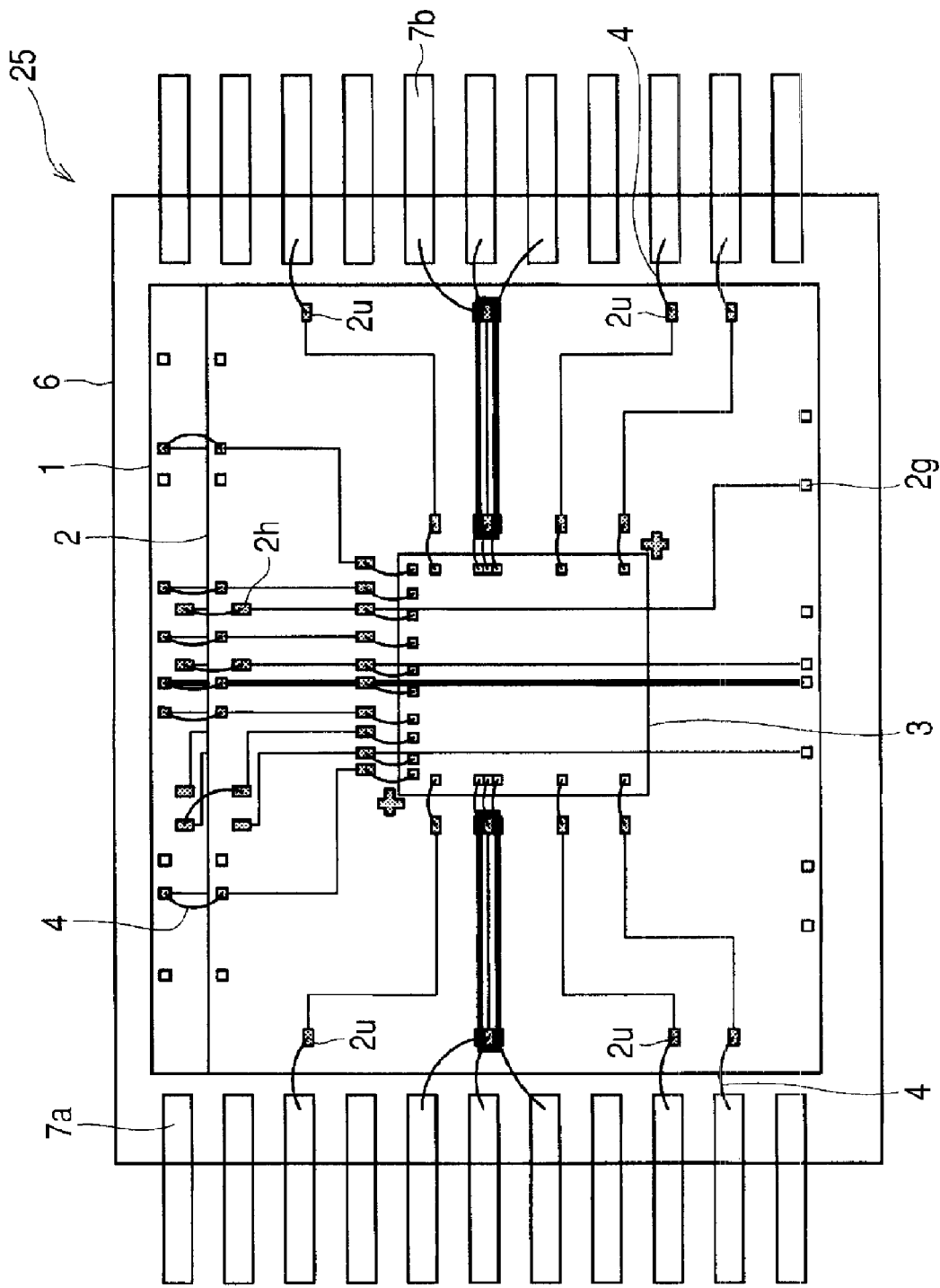
FIG. 37 is a plan view showing a modified example of layout of re-wiring lines formed on a main surface of an upper-stage memory chip.
Figure 38A:
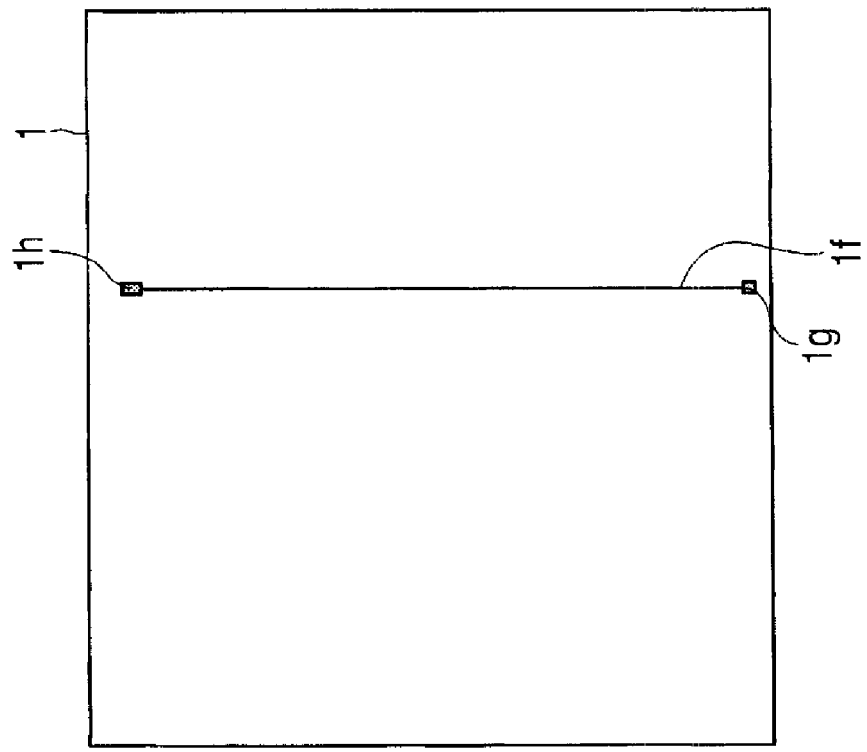
FIG. 38(a) is a plan view showing a modified example of layout of a re-wiring line formed on a main surface of an upper-stage memory chip and FIG. 38(b) is a plan view showing a modified example of layout of a re-wiring line formed on a main surface of a lower-stage memory chip.
Figure 38B:
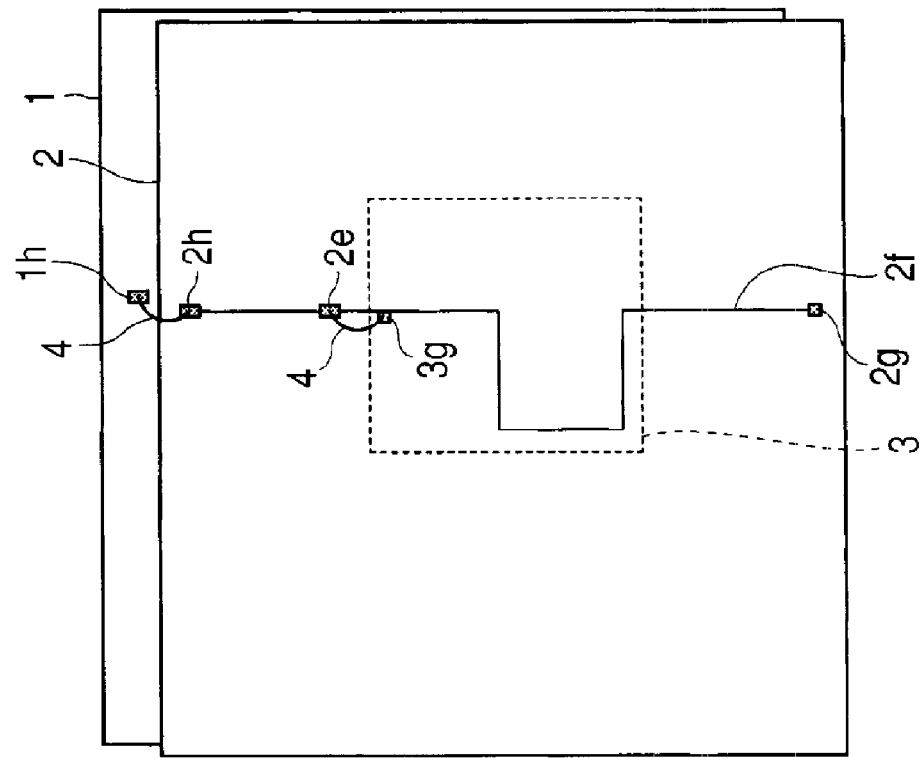

Although in the above embodiment a description has been given about the case where the wiring pattern (layout of re-wiring lines 2*f*) of the first memory chip 1 and the wiring pattern (layout of re-wiring lines 2*f*) of the second memory chip 2 are completely the same, both memory chips 1 and 2 may be different in the wiring pattern (layout of re-wiring lines 2*f*). This point will now be described in more detail. Since in this embodiment terminals (inner leads 7*a*, bonding leads) of the substrate (lead frame 7) are formed along the sides of the semiconductor chips 1, 2 and 3 which are each quadrangular in plan, the pads 2*u* for coupling with the external LSI positioned in the exterior of the system are arranged along the sides (short and long sides) of the second memory chip 2. However, for example in the case of such an SOP (Small Outline Package) 25 type semiconductor device as shown in FIG. 37 or in case of mounting a semiconductor chip on a substrate of almost the same size as the outline size of the semiconductor chip, plural terminals formed on the substrate are arranged along plural sides (two sides) out of the four sides of the semiconductor chip. In view of this point, as shown in FIG. 37, plural pads 28 for coupling with the external LSI out of plural pads on the top-stage memory chip (second memory chip 2) are gathered to two sides, whereby the coupling with the substrate terminals can be facilitated. Further, as shown in FIGS. 6, 7 and 38(*b*), the distance from a relocation pad 2*e* coupled to an electrode (electrode for internal interface) 3*g* (3*c*) of the microcomputer chip 3 through a wire 4 up to a pad (original pad covered with the overlying second memory chip 2) 1*g* arranged along the lower side (long side) of the underlying memory chip (first memory chip 1) is longer than the distance from the relocation pad 2*e* coupled to the electrode (electrode for internal interface) 3*g* (3*c*) of the microcomputer chip 3 up to a pad 2*g* arranged along the lower side (long side) of the overlying memory chip (second memory chip 2). One cause is that the pad on the second memory chip 2 and the pad on the first memory chip 1 are coupled together through a wire 4. Consequently, the wiring lengths (wiring route lengths) up to the original pads 2*g* and 1*g* of the overlying memory chip (second memory chip 2) and the underlying memory chip (first memory chip 1) are difficult to be made equal in length and there occur variations in signals (data) which are inputted and outputted through the electrodes 3*g* (3*c*) for internal interface of the microcomputer chip 3. In case of inputting or outputting signals (data) simultaneously to or from the two memory chips 1 and 2, there is a fear that the system may not operate. Therefore, as shown in FIG. 38(*a*), it is preferable that the wiring pattern (layout of re-wiring lines 2*f*) on the main surface of the overlying memory chip (second memory chip 2) be formed differently from the wiring pattern on the underlying memory chip (first memory chip 1). In more particular terms, it is preferable that the wiring pattern formed on the main surface of the overlying memory chip (second memory chip 2) be meandered so as to become longer than the wiring pattern formed on the underlying memory chip (first memory chip 1).

Further, although in the above embodiment it has been described that plural relocation pads 2*h* and 2*j* formed along the long sides of each memory chip are arranged at positions closer to the microcomputer chip than the original pads 2*g* and 2*i* arranged in the first row, no limitation is made thereto. For example, as shown in FIG. 8, if the number of the original pads 2*g* and 2*i* is small and if there is a space in the same row (first row) as the arranged row of those original pads, the relocation pads 2*h* and 2*j* may be arranged in the first row.

The present invention is suitable for an electronic device having a plurality of stacked semiconductor chips.

What is claimed is:

1. A semiconductor device comprising:

a memory chip having a front surface with a first front side and a second front side perpendicular to the first front side in a plan view, a plurality of first pads formed on the front surface and arranged along the first front side, a plurality of second pads formed on the front surface, the second pads being arranged along the first front side and further from a periphery of the front surface than the first pads in the plan view, a plurality of third pads formed on the front surface and arranged along the second front side, a plurality of fourth pads formed on the front surface, the fourth pads being arranged along the second front side and further from the periphery of the front surface than the third pads in the plan view, a first wiring coupling the first pads and the second pads, respectively, a second wiring coupling the third pads and the fourth pads, respectively, and a rear surface opposite to the front surface;

a microcomputer chip having a main surface with a first main side and a second main side perpendicular to the first main side in the plan view, a plurality of first electrodes formed on the main surface and arranged along the first main side, a plurality second electrodes formed on the main surface and arranged along the second main side, and a back surface opposite to the main surface, and mounted over the front surface of the memory chip such that the first, second, third and fourth pads are exposed from the microcomputer chip in the plan view, and such that the back surface of the microcomputer chip faces to the front surface of the memory chip;

a plurality of terminals arranged next to the memory chip in the plan view;

a plurality of first wires coupling the first electrodes and the second pads, respectively;

a plurality second wires coupling the second electrodes and the fourth pads, respectively; and a plurality of third wires coupling the third pads and the terminals, respectively;

wherein the second and fourth pads are arranged closer to the microcomputer chip than the first and third pads, respectively, in the plan view;

wherein each of the first electrodes is an electrode for internal interface to perform input and output of data for the interior of a system comprised of the memory chip and the microcomputer chip; and wherein each of the second electrodes is an electrode for external interface to perform input and output of data for the exterior of the system.

2. The semiconductor device according to claim 1,
wherein the first and second pads are arranged closer to the first front side than the second front side;
wherein the third and fourth pads are arranged closer to the second front side than the first front side;
wherein the first electrodes are arranged closer to the first main side than the second main side;
wherein the second electrodes are arranged closer to the second main side than the first main side; and
wherein the microcomputer chip is mounted over the memory chip such that the first and second main sides are arranged next to the first and second front sides, respectively, in the plan view.

3. The semiconductor device according to claim 1, wherein a size of the microcomputer chip is smaller than that of the memory chip in the plan view.

4. The semiconductor device according to claim 1, wherein the terminals are arranged along the second front side of the memory chip in the plan view.

* * * * *